United States Patent
Nakajima et al.

(10) Patent No.: US 10,133,413 B2
(45) Date of Patent: Nov. 20, 2018

(54) INPUT STATE DETECTION DEVICE

(71) Applicant: Sumitomo Riko Company Limited, Aichi (JP)

(72) Inventors: Hiroyuki Nakajima, Aichi (JP); Tomonori Hayakawa, Aichi (JP); Tetsuyoshi Shibata, Aichi (JP); Hirokazu Yamamoto, Aichi (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 59 days.

(21) Appl. No.: 14/810,716

(22) Filed: Jul. 28, 2015

(65) Prior Publication Data
US 2015/0346907 A1 Dec. 3, 2015

Related U.S. Application Data

(63) Continuation of application No. PCT/JP2014/067440, filed on Jun. 30, 2014.

(30) Foreign Application Priority Data

Jul. 30, 2013 (JP) .................................. 2013-157806

(51) Int. Cl.
*G06F 3/041* (2006.01)
*G06F 3/044* (2006.01)
(Continued)

(52) U.S. Cl.
CPC .......... *G06F 3/0418* (2013.01); *G06F 1/3262* (2013.01); *G06F 3/044* (2013.01);
(Continued)

(58) Field of Classification Search
CPC ...... G06F 3/044; G06F 3/0418; G06F 3/0416; G06F 1/3262; G06F 2203/04101; H03K 17/962

See application file for complete search history.

(56) References Cited

U.S. PATENT DOCUMENTS 5,792,997 A * 8/1998 Fukuzaki ................ G06F 3/046
178/18.07
6,239,788 B1 * 5/2001 Nohno .................. G06F 3/0412
178/18.03
(Continued)

FOREIGN PATENT DOCUMENTS

JP 2010-217967 9/2010
JP 2012-022635 A 2/2012

OTHER PUBLICATIONS

Extended European Search Report, dated Jul. 26, 2016, from the European Patent Office (EPO) in the corresponding European Patent Application No. 14831907.2.
(Continued)

*Primary Examiner* — Christopher E Leiby

(74) *Attorney, Agent, or Firm* — Greenblum & Bernstein, P.L.C.

(57) ABSTRACT

Provided is an input state detection device capable of reliably detecting contact and pressing of an object. A state switching switch can switch a first state in which a voltage application terminal of a constant-voltage power supply is connected to a side of a first electrode and a detection terminal of a detector is connected to a side of second electrodes, and a second state in which the voltage application terminal of the constant-voltage power supply is connected to the side of the second electrodes and the detection terminal of the detector is connected to the side of the first electrode. An input detector detects whether the object is in a non-contact state or in a contact but not pressing state with respect to a surface on the side of the second electrodes based on a value detected by the detector with the state switching switch in the first state.

21 Claims, 11 Drawing Sheets

(51) Int. Cl.
*G06F 1/32* (2006.01)
*H03K 17/96* (2006.01)
(52) U.S. Cl.
CPC ......... *G06F 3/0416* (2013.01); *H03K 17/962* (2013.01); *G06F 2203/04101* (2013.01)

(56) References Cited

U.S. PATENT DOCUMENTS

| | | | | |
|---|---|---|---|---|
| 8,432,371 | B2* | 4/2013 | Hotelling | G06F 3/0412 345/104 |
| 8,902,189 | B2* | 12/2014 | Park | G06F 3/045 257/72 |
| 2008/0018608 | A1 | 1/2008 | Serban et al. | |
| 2008/0018611 | A1* | 1/2008 | Serban | G06F 3/0416 345/173 |
| 2010/0230181 | A1* | 9/2010 | Suzuki | G06F 3/044 178/18.06 |
| 2010/0300862 | A1* | 12/2010 | Tamura | G06F 3/0412 200/600 |
| 2015/0028895 | A1* | 1/2015 | Tseng | G06F 3/044 324/679 |
| 2015/0206669 | A1* | 7/2015 | Hauck | H03K 17/962 200/5 A |
| 2016/0054366 | A1* | 2/2016 | Takahashi | G06F 3/044 324/537 |

OTHER PUBLICATIONS

"Notification of Reasons for Refusal" by the Japan Patent Office (JPO), dated Nov. 14, 2017, for the corresponding Japanese Patent Application No. 2015-529468 (together with an English language translation thereof).

* cited by examiner

INPUT STATE DETECTION DEVICE

CROSS REFERENCE TO RELATED APPLICATIONS

The present application is a Continuation application of International Application No. PCT/JP2014/067440, filed Jun. 30, 2014, which claims priority to Japanese Patent Application No. 2013-157806, filed on Jul. 30, 2013, the entire contents of which are incorporated herein by reference in their entireties.

BACKGROUND OF THE INVENTION

Field of the Invention

The present invention relates to an input state detection device for detecting contact or pressing of an electrically conductive object such as a human finger.

Description of the Related Art

A patent Literature 1(PL1) describes a device capable of detecting approach and pressing of a human finger by using an electrostatic capacitive sensor. As a finger approaches a first electrode, variable capacitance increases. In addition, as the first electrode and a second electrode get closer to each other by the finger's pressing the first electrode by way of an electrically insulating sheet, the variable capacitance increases. Detection of touch of the finger and detection of pressing of the finger are carried out by monitoring a change in potential or electric current of the first electrode and a change in potential or electric current of the second electrode.

PL1: JP2010-217967A

Here, in a detection circuit described in Patent Literature 1, potential or an electric current detected when a finger presses the first electrode is affected by a change in potential or electric current of a side of the first electrode and a change in potential or electric current of a side of the second electrode. Therefore, there is a risk that the detected potential or electric current is unstable depending magnitude of pressing force.

The present invention has been made in view of these circumstances. It is an object of the present invention to provide an input state detection device capable of reliably detecting contact and pressing of an object.

SUMMARY OF INVENTION

In order to solve the above problem, the present inventors employ a constant-voltage power supply device and connect a detector in series with an electrostatic capacitive sensor so that the electrostatic capacitive sensor is disposed between a voltage application terminal of the constant-voltage power supply device and a detection terminal of the detector. When contact of an object is to be detected, a circuit is formed so that the object contacts an electrode on a side of the detection terminal of the detector, i.e., an electrode opposite to the voltage application terminal of the constant-voltage power supply device. When pressing of the object is to be detected, a circuit is formed so that the object presses an electrode on an opposite side of the detection terminal of the detector, i.e., an electrode on a side of the voltage application terminal of the constant-voltage power supply device. That is to say, a positional relation between the object and the electrodes of the electrostatic capacitive sensor in a circuit structure of the present invention is opposite to that of PL1. Hereinafter, details of the present solution will be described.

An input state detection device according to the present invention comprises an electrostatic capacitive sensor having a first electrode attached to a substrate, a second electrode located on a side of an electrically conductive object to be contacted, and a dielectric layer placed between the first electrode and the second electrode and to be compressed by pressing force applied on the second electrode by the object; a constant-voltage power supply device having a voltage application terminal connected to a side of the electrostatic capacitive sensor and applying a predetermined voltage to the electrostatic capacitive sensor; a detector connected in series with the electrostatic capacitive sensor, having a detection terminal connected to the side of the electrostatic capacitive sensor, and detecting potential of the detection terminal or an electric current flowing from the detection terminal which changes with electrostatic capacitance of the electrostatic capacitive sensor and electrostatic capacitance of the object; a state switching switch capable of switching a first state in which the voltage application terminal of the constant-voltage power supply device is connected to a side of the first electrode and the detection terminal of the detector is connected to a side of the second electrode, and a second state in which the voltage application terminal of the constant-voltage power supply device is connected to the side of the second electrode and the detection terminal of the detector is connected to the side of the first electrode; an input detector for detecting whether the object is in a non-contact state or in a contact but not pressing state with respect to a surface of the electrostatic capacitive sensor on the side of the second electrode based on a value detected by the detector with the state switching switch in the first state, and whether the object is in the contact but not pressing state or in a pressing state with respect to the second electrode based on a value detected by the detector with the state switching switch in the second state.

That is to say, the input detector detects whether the object is in a non-contact state or in a contact but not pressing state when the state switching switch is in the first state. The first state is a state in which the voltage application terminal of the constant-voltage power supply device is connected to the side of the first electrode and the detection terminal of the detector is connected to the side of the second electrode, as mentioned before. That is to say, the object is connected in series with the electrostatic capacitive sensor and in parallel to the detector. In this case, upon contact of the electrically conductive object, an electric current flowing in the circuit is branched from the electrostatic capacitive sensor into a route of the detector and a route of the object. Accordingly, upon contact of the object, a value detected by the detector clearly decreases. Thus, whether the object is in the non-contact state or in the contact but not pressing state can be reliably determined.

On the other hand, the input detector detects whether the object is in the contact but not pressing state or in a pressing state when the state switching switch is in the second state. The second state is a state in which the voltage application terminal of the constant-voltage power supply device is connected to the side of the second electrode and the detection terminal of the detector is connected to the side of the first electrode, as mentioned before. That is to say, the object is connected in parallel to the electrostatic capacitive sensor and the detector. In this case, upon pressing by the electrically conductive object, the electric current flowing in the circuit is branched from the constant-voltage power supply device to a route of the electrostatic capacitive sensor and the detector and a route of the object. In this case, due to the abovementioned parallel connection, a voltage applied to the electrostatic capacitive sensor and the detector is a voltage applied by the constant-voltage power supply device regardless of pressing by the object. Therefore, as the electrostatic capacitance of the electrostatic capacitive sensor is increased by pressing by the object, a value detected by the detector increases. Thus, whether the object is in the contact but not pressing state or in the pressing state can be reliably determined.

Hereinafter, preferred embodiments of the input state detection device according to the present invention will be described.

Preferably, the predetermined voltage applied by the constant-voltage power supply device is a cyclic voltage; and the detector is an ammeter for detecting an electric current flowing from the detection terminal as a value proportional to the electrostatic capacitance of the electrostatic capacitive sensor and the electrostatic capacitance of the object. The electric current detected by the ammeter has a value proportional to the electrostatic capacitance of the electrostatic capacitive sensor and the electrostatic capacitance of the object. Therefore, whether the object is in the non-contact state, the contact but not pressing state, or the pressing state can be detected by using the electric current detected by the ammeter.

Moreover, the detector can employ the following circuit instead of the ammeter. That is to say, the detector can comprise abridge capacitor connected between the detection terminal of the detector and ground potential; a charge and discharge switching element connected in parallel to the bridge capacitor and discharging an electric charge of the detection terminal to the ground potential when closed; a charge and discharge control device performing a step of discharging the electric charge of the detection terminal to the ground potential when the constant-voltage power supply device does not apply the predetermined voltage to the electrostatic capacitive sensor, and a step of charging the electrostatic capacitive sensor by opening the charge and discharge switching element and causing the predetermined voltage to be applied by the constant-voltage power supply device after the discharging step; and a potential detector for detecting potential of the detection terminal as a value proportional to the electrostatic capacitance of the electrostatic capacitive sensor and the electrostatic capacitance of the object in the charging step performed by the charge and discharge control device.

Potential of the detection terminal detected by the detector thus constructed has a value proportional to the electrostatic capacitance of the electrostatic capacitive sensor and the electrostatic capacitance of the object. Accordingly, whether the object is in the non-contact state, the contact but not pressing state or the pressing state can be determined by using the potential detected by the abovementioned detector.

Moreover, preferably, the input detector detects magnitude of pressing force applied on the second electrode by the object, based on the value detected by the detector with the state switching switch in the second state. As mentioned before, when the state switching switch is in the second state, the potential of the detection terminal or the electric current flowing from the detection terminal is substantially affected by the electrostatic capacitance of the electrostatic capacitive sensor. Accordingly, an equivalent value of the electrostatic capacitance of the electrostatic capacitive sensor can be detected based on the value detected by the detector with the state switching switch in the second state. The electrostatic capacitance of the electrostatic capacitive sensor corresponds to magnitude of pressing force applied by the object. That is to say, the magnitude of pressing force applied by the object can be detected based on the value detected by the detector.

Moreover, preferably, the input state detection device comprises a controller for controlling the states of the state switching switch; the controller periodically switches the state switching switch between the first state and the second state; and the input detector periodically detects whether the object is in the non-contact state or in the contact but not pressing state and whether the object is in the contact but not pressing state or in the pressing state. That is to say, since the detection with the state switching switch in the first state and detection with the state switching switch in the second state are carried out alternately, pressing by the object can be detected at an early stage. Besides, a change of the object from the state of pressing the second electrode to the non-contact state can be detected at an early stage.

Moreover, preferably, a mode for causing the state switching switch to keep the first state is defined as a first mode, a mode for causing the state switching switch to keep the second state is defined as a second mode, and a mode for alternately and periodically switching the state switching switch between the first state and the second state is defined as a third mode; and the input state detection device comprises a controller for controlling the modes of the state switching device.

The controller switches the state switching switch from the first mode to the third mode when the object changes from the non-contact state to the contact but not pressing state, from the third mode to the first mode when the object changes from the contact but not pressing state to the non-contact state, from the third mode to the second mode when the object changes from the contact but not pressing state to the pressing state, and from the second mode to the third mode when the object changes from the pressing state to the contact but not pressing state.

Upon switching the state switching switch to the first mode for keeping the first state when the object is in the non-contact state as mentioned before, the input detector can reliably detect that the object has changed from the non-contact state to the contact but not-pressing state. Moreover, when the magnitude of pressing force is to be detected, upon switching the state switching switch to the second mode for keeping the second state when the object is in the pressing state, the input detector can detect the magnitude of pressing force with high precision.

However, determination of change from the first mode to the second mode and change from the second mode to the first mode is not easy. Therefore, according to the above, a change between the first mode and the second mode is carried out via a third mode. The third mode is a mode for alternately and periodically switching the first state and the second state. That is to say, when the state switching switch is in the third mode, the state switching switch can smoothly change to the first mode for keeping the first state and can also smoothly change to the second mode for keeping the second state.

Moreover, preferably, the input detector determines that the object changes from the non-contact state to the contact but not pressing state from the value detected by the detector with the state switching switch in the first state in the first mode being smaller than a first threshold value; determines that the object changes from the contact but not pressing state to the non-contact state from the value detected by the detector with the state switching switch in the first state in the third mode being greater than the first threshold value; determines that the object changes from the contact but not pressing state to the pressing state from the value detected by the detector with the state switching switch in the second state in the third mode being greater than a second threshold value; and determines that the object changes from the pressing state to the contact but not pressing state from the value detected by the detector with the state switching switch in the second state in the second mode being smaller than the second threshold value; and the controller retrieves a change in the non-contact state, the contact but not pressing state and the pressing state based on the determination by the input detector.

The input detector can reliably determine a change in the state of the object by using the first threshold value or the second threshold value when the input state switching device is in each of the modes. Therefore, the controller can suitably switch the modes.

Moreover, preferably, the first threshold value and the second threshold value are set such that a difference between the value detected by the detector with the state switching switch in the first state when the object is in the contact but not pressing state, and the first threshold value is greater than a difference between a value detected by the detector with the state switching switch in the second state when the object is in the contact but not pressing state, and the second threshold value.

Owing to this, when the object is in the contact but not pressing state, the controller can reliably determine whether the object has changed to the non-contact state or to the pressing state. As a result, when the state switching switch is in the third mode, the controller can reliably determine whether the state switching switch should be switched to the first mode or to the second mode.

Moreover, preferably, a mode for causing the state switching switch to keep the first state is defined as a first mode and a mode for causing the state switching switch to keep the second state is defined as a second mode; the input state detection device comprises a controller for controlling the states of the state switching switch; and the controller switches the state switching switch from the first mode to the second mode when the object changes from the non-contact state to the contact but not pressing state, and from the second mode to the first mode when the object changes from the pressing state to the contact but not pressing state. Owing to this, whether the object is in the non-contact state, the contact but not pressing state, or the pressing state can be detected. In this case, the number of switch operations by the state switching switch can be decreased and consumption energy can be reduced.

Moreover, preferably, a plurality of the electrostatic capacitive sensors are constituted by having at least either a plurality of first electrodes or a plurality of second electrodes; and the input detector detects a position of the object. Owing to this, a position where the object contacts or presses can be detected.

Moreover, preferably, the dielectric layer is formed of an elastomer or resin. Furthermore, preferably, the first electrode and the second electrode are formed by mixing an electrically conductive filler in an elastomer. Upon formed as mentioned above, the first electrode and the second electrode attain flexibility and capability to expand and contract.

BRIEF DESCRIPTION OF DRAWINGS

FIG. 6 are timing charts in Example 1 in which FIG. 6(a) shows a position of a human finger as an object, FIG. 6(b) shows a value detected by an ammeter with the state switching switch in the first state, FIG. 6(c) shows a value detected by the ammeter with the state switching switch in the second state, and FIG. 6(d) shows a timing of switching by a controller.

In FIG. 8, T1 to T4 are common with those of FIG. 6.

In FIG. 9, T1 to T4 are common with those of FIG. 6.

DESCRIPTION OF EMBODIMENTS

First Embodiment (1. Overview of Input State Detection Device)

An input state detection device of this embodiment includes an electrostatic capacitive sensor unit 10 and detects that an electrically conductive object has contacted the electrostatic capacitive sensor unit 10 and that the object has pressed the electrostatic capacitive sensor unit 10. For example, the electrically conductive object is a human finger and the input state detection device detects that the human finger has contacted the electrostatic capacitive sensor unit 10 and that the human finger has pressed the electrostatic capacitive sensor unit 10. Furthermore, when the human finger presses the electrostatic capacitive sensor unit 10, the input state detection device can also detect pressing force.

(2. Description of Electrostatic Capacitive Sensor)

The input state detection device includes the electrostatic capacitive sensor unit 10 as mentioned above. First, the electrostatic capacitive sensor unit 10 will be described with reference to FIGS. 1 and 2. The electrostatic capacitive sensor unit 10 is constituted by a plurality of electrostatic capacitive sensors 1 to be mentioned later. The electrostatic capacitive sensor unit 10, however, can be constituted by one electrostatic capacitive sensor 1.

Figure 1:
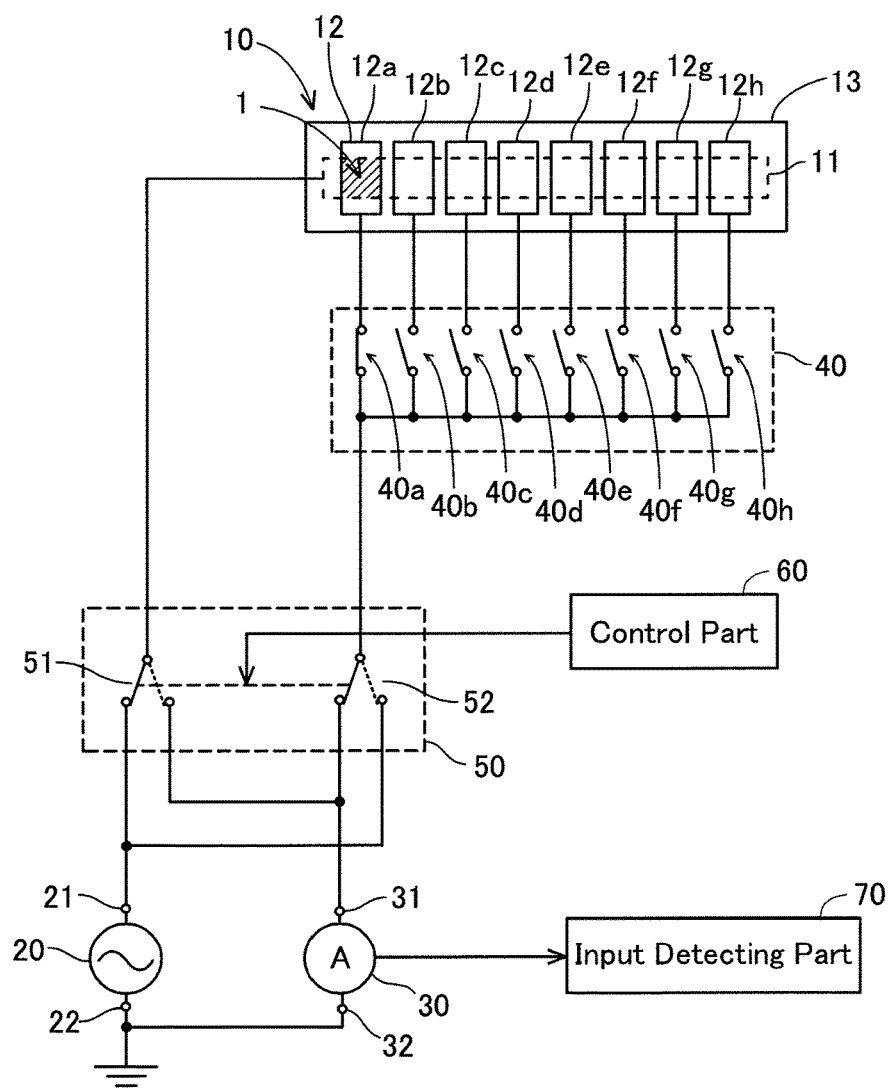
FIG. 1 shows configuration of an input state detection device in a first embodiment in which an electrostatic capacitive sensor unit is seen from a perpendicular direction to a plane.
Figure 2:
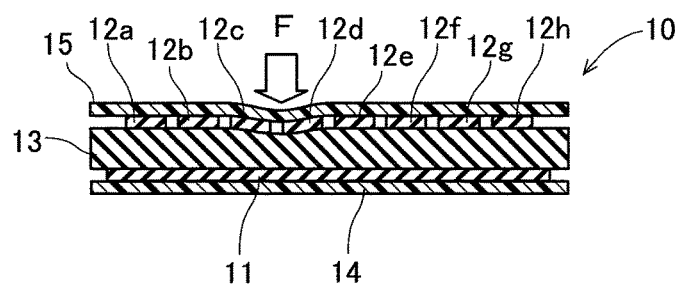
FIG. 2 shows a cross-sectional view of the electrostatic capacitive sensor unit shown in FIG. 1.

As shown in FIGS. 1 and 2, the electrostatic capacitive sensor unit 10 of this embodiment comprises a substrate 14, a first electrode 11, a plurality of second electrodes 12a to 12h, a dielectric layer 13, and a surface skin layer 15. As shown in FIG. 2, the substrate 14 is formed of an electrically insulating resin or the like, and located on a rear surface side of the electrostatic capacitive sensor unit 10. As shown in FIG. 2, the first electrode 11 is attached to a front surface side of the substrate 14. As shown in FIG. 1, the first electrode 11 has a strip shape.

As shown in FIG. 2, the plurality of second electrodes 12a to 12h are disposed so as to face the first electrode 11 with a distance therebetween in a perpendicular direction to a plane of the first electrode 11. That is to say, the plurality of second electrodes 12a to 12h are located on a side of the electrically conductive object to be contacted with respect to the first electrode 11. Moreover, as shown in FIG. 1, the plurality of second electrodes 12a to 12h respectively have a strip shape and are arranged in parallel to each other. Here, the plurality of second electrodes 12a to 12h are arranged in a row in an extending direction of the first electrode 11.

Therefore, facing positions of the first electrode 11 and the plurality of second electrodes 12a to 12h are arranged in a row. In FIG. 1, eight facing positions are arranged in a row in the electrostatic capacitive sensor unit 10.

Here, the respective electrodes 11, 12a to 12h are formed by mixing an electrically conductive filler in an elastomer. Upon thus formed, the respective electrodes 11, 12a to 12h can attain flexibility and capability to expand and contract. Examples of the elastomer constituting the respective electrodes 11, 12a to 12h include silicone rubber, ethylene-propylene copolymer rubber, natural rubber, styrene-butadiene copolymer rubber, acrylonitrile-butadiene copolymer rubber, acrylic rubber, epichlorohydrin rubber, chlorosufonated polyethylene, chlorinated polyethylene, and urethane rubber. Moreover, the electrically conductive filler to be mixed in the respective electrodes 11, 12a to 12h only has to be electrically conductive particles and can be, for example, fine particles of carbon materials, metal, etc.

As shown in FIG. 2, the dielectric layer 13 is placed between the first electrode 11 and each of the plurality of second electrodes 12a to 12h, and is to be compressed by pressing force applied on a surface of the electrostatic capacitive sensor unit 10 on a side of the plurality of second electrodes 12a to 12h by a human finger. The dielectric layer 13 is formed of an elastomer or resin, and has flexibility just like the first electrode 11 and the second electrodes 12a to 12h. Examples of the elastomer constituting the dielectric layer 13 include silicone rubber, acrylonitrile-butadiene copolymer rubber, acrylic rubber, epichlorohydrin rubber, chlorosufonated polyethylene, chlorinated polyethylene, and urethane rubber. Examples of the resin constituting the dielectric layer 13 include polyethylene resin, polypropylene resin, polyurethane resin, polystyrene resin (including cross-linked polystyrene resin foam), polyvinyl chloride-polyvinylidene chloride copolymer, and ethylene-acetic acid copolymer. It is more preferred that the dielectric layer 13 is an elastomer capable of great elastic deformation when compressed. Great compressive deformation is preferred in order to induce a great change in electrostatic capacitance.

As shown in FIG. 2, the surface skin layer 15 is placed so as to cover a front surface side of the plurality of second electrodes 12a to 12h. The surface skin layer 15 is formed of an electrically insulating material and has flexibility and capability to expand and contract. That is to say, when a human finger presses the surface skin layer 15 (corresponding to "a surface of the electrostatic capacitive sensor on a side of the second electrode") and, as a result, compressively deforms the dielectric layer 13, the surface skin layer 15 can conform to the deformation of the dielectric layer 13. The surface skin layer 15 is formed, for example, of one of the materials described as the examples of the elastomer or resin constituting the dielectric layer 13.

In the electrostatic capacitive sensor unit 10 having the above configuration, the first electrode 11 and the respective plurality of second electrodes 12a to 12h face each other at eight positions arranged in a row. Here, the first electrode 11, anyone of the plurality of second electrodes 12a to 12h, which constitute a facing position, and the dielectric layer 13 placed therebetween form one electrostatic capacitive sensor 1 (shown in FIG. 3). That is to say, the electrostatic capacitive sensor unit 10 has eight electrostatic capacitive sensors 1.

When the surface skin layer 15 is pressed by a human finger in a perpendicular direction to a plane of the electrostatic capacitive sensor unit 10 with pressing force F, the dielectric layer 13 is compressively deformed in the perpendicular direction to the plane, so a distance between a pair of electrodes constituting one electrostatic capacitive sensor 1 located at that portion decreases. As a result, electrostatic capacitance of the electrostatic capacitive sensor 1 located at that portion increases. On the other hand, when a human finger contacts but does not press the surface skin layer 15, the dielectric layer 13 is not compressively deformed, so electrostatic capacitance of all the electrostatic capacitive sensors 1 does not change.

Here, the respective electrodes 11, 12a to 12h are formed of a material having flexibility and capability to expand and contract as mentioned above. Therefore, the respective electrodes 11, 12a to 12h have higher resistance than electrodes formed of mere electrically conductive metal plates. Therefore, for example, when a facing position of the first electrode 11 and one second electrode 12a is assumed to be as one electrostatic capacitive sensor 1 at a target position, the first electrode 11 and the second electrode 12a which extend until reaching the target position serve as resistances 3, 4 (shown in FIG. 3) connected in series with the electrostatic capacitive sensor 1 at the target position. That is to say, the electrostatic capacitive sensor unit 10 has the electrostatic capacitive sensor 1 and the resistances 3, 4 connected in series with both sides of the electrostatic capacitive sensor 1, respectively.

(3. Description of Other Constitutional Elements of Input State Detection Device)

Next, constitutional elements of the input state detection device other than the electrostatic capacitive sensor unit 10 will be described with reference to FIG. 1. As shown in FIG. 1, the input state detection device comprises a constant-voltage power supply device 20, an ammeter 30, an electrode switching device 40, a state switching switch 50, a controller 60, and an input detector 70, in addition to the electrostatic capacitive sensor unit 10.

The constant-voltage power supply device 20 is a power source which has a voltage application terminal 21 connected to a side of the electrostatic capacitive sensors 1 and applies a cyclic voltage (e.g., AC voltage and rectangular voltage) to one of the electrostatic capacitive sensors 1. An earth terminal 22 of the constant-voltage power supply device 20 is connected to ground potential.

The ammeter 30 (a detector) is connected in series with the electrostatic capacitive sensors 1. In particular, a detection terminal 31 of the ammeter 30 is connected to a side of the electrostatic capacitive sensors 1, and an earth terminal 32 of the ammeter 30 is connected to ground potential. That is to say, the electrostatic capacitive sensors 1 are connected between the voltage application terminal 21 of the constant-voltage power supply device 20 and the detection terminal 31 of the ammeter 30. Moreover, the earth terminal 32 of the ammeter 30 is connected to the earth terminal 22 of the constant-voltage power supply device 20. The ammeter 30 detects an electric current flowing from the detection terminal 31. Here, the electric current detected by the ammeter 30 changes with electrostatic capacitance of one of the electrostatic capacitive sensors 1 and electrostatic capacitance of a human finger as an object.

One side of the electrode switching device 40 is connected to a side of the voltage application terminal 21 of the constant-voltage power supply device 20 or a side of the detection terminal 31 of the ammeter 30, while the other side of the electrode switching device 40 is connected to one end (a lower end in FIG. 1) of each of the second electrodes 12a to 12h in the row. The electrode switching device 40 has switches 40a to 40h, and closes (turns on) one of the switches 40a to 40h connected to one of the plurality of second electrodes 12a to 12h set beforehand in accordance with each measurement target and opens (turns off) the remaining switches. In FIG. 1, when a hatched electrostatic capacitive sensor 1 is a measurement target, a switch 40a connected to a second electrode 12a is closed and the remaining switches 40b to 40h are opened.

The state switching switch 50 has a first switch 51 and a second switch 52. One end of the first switch 51 is connected to the first electrode 11. The other end of the first switch 51 can be selectively switched between connection to the voltage application terminal 21 of the constant-voltage power supply device 20 and connection to the detection terminal 31 of the ammeter 30. On the other hand, one end of the second switch 52 is connected to the second electrodes 12a to 12h byway of the electrode switching device 40. The other end of the second switch 52 can be selectively switched between connection to the voltage application terminal 21 of the constant-voltage power supply device 20 and connection to the detection terminal 31 of the ammeter 30.

Switch operations of the first switch 51 and the second switch 52 of the state switching switch 50 are controlled by the controller 60. The controller 60 controls the state switching switch 50 so that the first switch 51 and the second switch 52 operate in conjunction with each other. Specifically, when the first switch 51 is connected to a side of the voltage application terminal 21 of the constant-voltage power supply device 20, the second switch 52 is connected to a side of the detection terminal 31 of the ammeter 30. On the other hand, when the first switch 51 is connected to the side of the detection terminal 31 of the ammeter 30, the second switch 52 is connected to the side of the voltage application terminal 21 of the constant-voltage power supply device 20. That is to say, the controller causes one of the voltage application terminal 21 of the constant-voltage power supply device 20 and the detection terminal 31 of the ammeter 30 to be connected to the first electrode 11, and the other to be connected to a selected one of the second electrodes 12a to 12h.

Here, a state in which the first switch 51 is connected to the side of the voltage application terminal 21 of the constant-voltage power supply device 20 and the second switch 52 is connected to the side of the detection terminal 31 of the ammeter 30 is referred to as a first state. On the other hand, a state in which the first switch 51 is connected to the side of the detection terminal 31 of the ammeter 30 and the second switch 52 is connected to the side of the voltage application terminal 21 of the constant-voltage power supply device 20 is referred to as a second state.

That is to say, the state switching switch 50 can switch the first state in which the voltage application terminal 21 of the constant-voltage power supply device 20 is connected to the side of the first electrode 11 and the detection terminal 31 of the ammeter 30 is connected to the side of the second electrodes 12a to 12h, and the second state in which the voltage application terminal 21 of the constant-voltage power supply device 20 is connected to the side of the second electrodes 12a to 12h and the detection terminal 31 of the ammeter 30 is connected to the side of the first electrode 11.

The input detector 70 detects whether a human finger as an object has contacted but not pressed (hereafter referred to as being "in a contact but not pressing state" with respect to) a surface of the electrostatic capacitive sensor unit 10 on the side of the second electrodes 12a to 12h or not, based on a value detected by the ammeter 30. That is to say, the input detector 70 detects whether the human finger is in a non-contact state or in a contact but not pressing state with respect to the electrostatic capacitive sensor unit 10. The input detector 70 also detects that the human finger as the object has applied pressing force to the electrostatic capacitive sensor unit 10 based on the value detected by the ammeter 30. That is to say, the input detector 70 detects whether the human finger is in the contact but not pressing state or in a pressing state with respect to the electrostatic capacitive sensor unit 10.

More specifically, the input detector 70 detects whether the human finger as the object is in the non-contact state or in the contact but not pressing state based on the value detected by the ammeter 30 with the state switching switch 50 in the first state. The input detector 70 also detects whether the human finger as the object is in the contact but not pressing state or in the pressing state based on the value detected by the ammeter 30 with the state switching switch 50 in the second state. Moreover, when pressing force is applied, the input detector 70 detects magnitude of pressing force based on the value detected by the ammeter 30 with the state switching switch in the second state.

(4. Description of Equivalent Circuit of Input State Detection Device)

Figure 3:
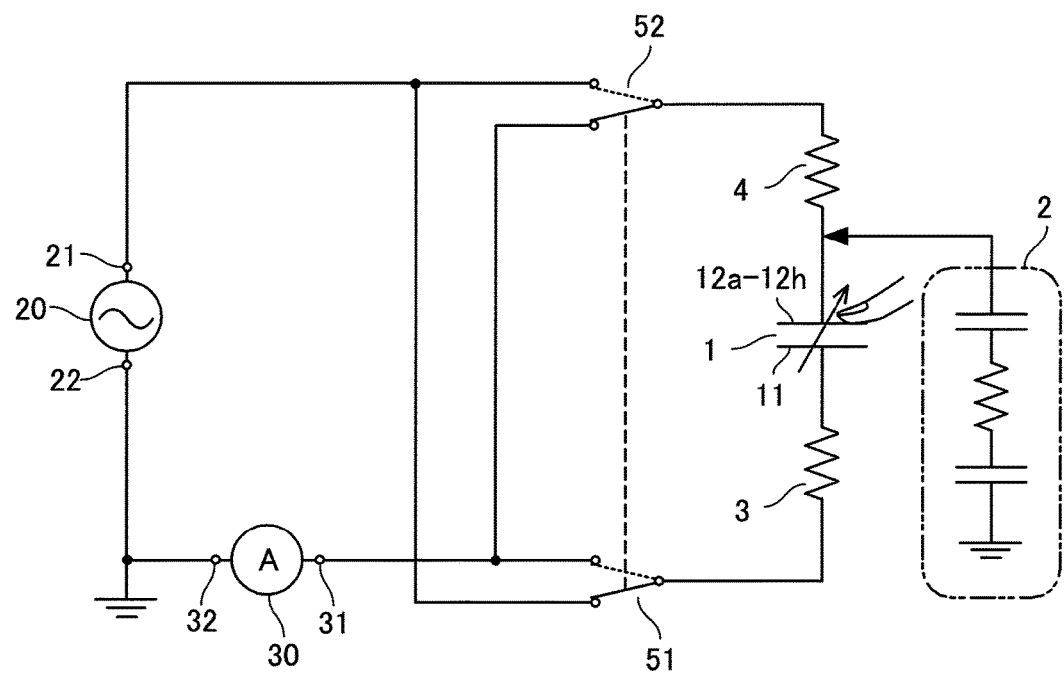
FIG. 3 shows an equivalent circuit of the input state detection device.

Next, an equivalent circuit of the abovementioned input state detection device will be described with reference to FIG. 3. FIG. 3 shows an equivalent circuit when any one of the electrostatic capacitive sensors 1 of the electrostatic capacitive sensor unit 10 is a measurement target.

As shown in FIG. 3, the electrostatic capacitive sensor 1 is variable and the resistance 3 is connected in series with the side of the first electrode 11 of the electrostatic capacitive sensor 1, and the resistance 4 is connected in series with the side of one of the second electrodes 12a to 12h of the electrostatic capacitive sensor 1. When the state switching switch 50 is in the first state (indicated by solid lines of the switches 51, 52 in FIG. 3), the voltage application terminal 21 of the constant-voltage power supply device 20 is connected to the side of the first electrode 11 of the electrostatic capacitive sensor 1, and the detection terminal 31 of the ammeter 30 is connected in series with the side of the one of the second electrodes 12a to 12h of the electrostatic capacitive sensor 1. When the state switching switch 50 is in the second state (indicated by broken lines of the switches 51, in FIG. 3), the voltage application terminal 21 of the constant-voltage power supply device 20 is connected to the side of the one of the second electrodes 12a to 12h of the electrostatic capacitive sensor 1 and the detection terminal 31 of the ammeter 30 is connected in series with the side of the first electrode 11 of the electrostatic capacitive sensor 1.

Here, an equivalent circuit of the human finger 2 as the object will be described. As indicated in a two-dot chain line box in FIG. 3, the human finger 2 is expressed, for example, by a series circuit comprising a capacitor of 2200 pF, a resistance of 1 to 10 kΩ, and a capacitor of 100 pF. That is to say, when the human finger 2 contacts or presses the surface skin layer 15, the equivalent circuit of that object is connected to the side of the second electrodes 12a to 12h.

(5. Contact Detection in First State)

Figure 4:
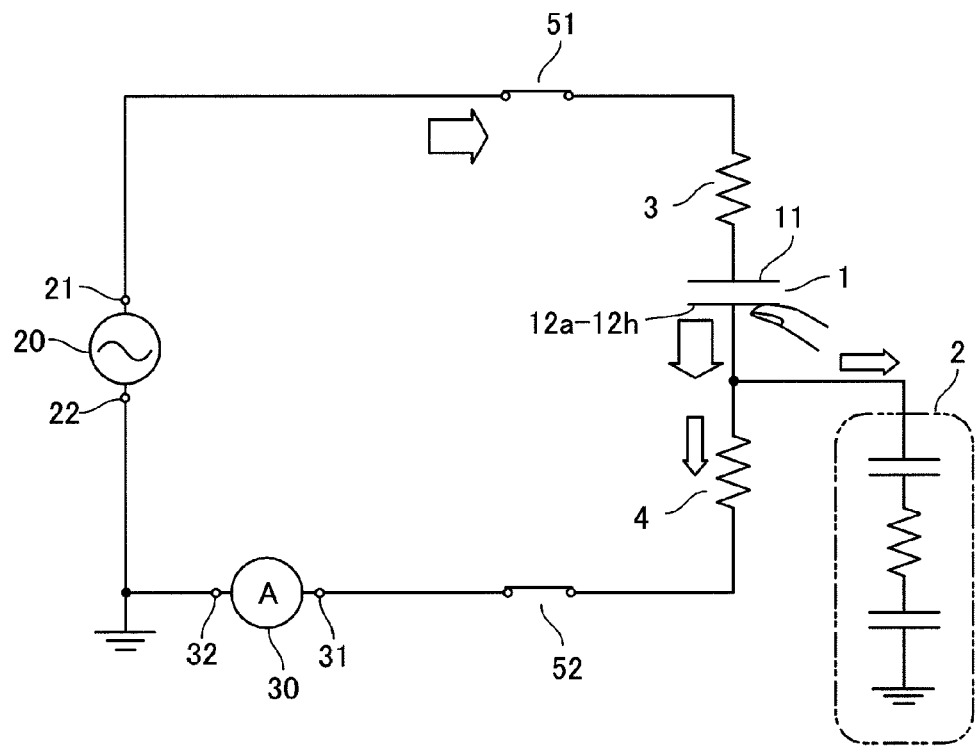
FIG. 4 shows an equivalent circuit of the input state detection device when a state switching switch is in a first state.

Next, we will consider a case in which the human finger 2 as the object has contacted the surface skin layer 15 when the state switching switch 50 is in the first state. A circuit in this case is shown in FIG. 4. That is to say, a cyclic voltage is applied to the side of the first electrode 11 by the constant-voltage power supply device 20. On the other hand, the one of the second electrodes 12a to 12h is connected to the detection terminal 31 of the ammeter 30 by way of the resistance 4. The human finger 2 is connected between the one of the second electrodes 12a to 12h and the detection terminal 31 of the ammeter 30. That is to say, an equivalent circuit of the human finger 2 is connected in series with the electrostatic capacitive sensor 1 and in parallel to a series circuit of the ammeter 30 and the resistance 4.

In this case, an electric current supplied by the constant-voltage power supply device 20 passes through the electrostatic capacitive sensor 1 and then is branched into a route of the ammeter 30 and the resistance 4 and a route of the equivalent circuit of the human finger 2. Therefore, in a moment when the electric current flows from the one of the second electrodes 12a to 12h to the side of the human finger 2, the electric current flowing into the ammeter 30 decreases. Here, in the moment when the electric current flows from the one of the second electrodes 12a to 12h to the side of the human finger 2, the finger 2 needs to be electrically connected between the one of the second electrodes 12a to 12h and the resistance 4, and this moment is substantially equal to a moment when the human finger 2 contacts the surface skin layer 15.

When the state switching switch 50 is in the first state and the human finger 2 as the object has thus contacted the surface skin layer 15, a value detected by the ammeter 30 decreases from a last value. Therefore, the input detector 70 detects whether the human finger 2 is in a non-contact state or in a contact but not pressing state with respect to the surface skin layer 15 based on the value detected by the ammeter 30 with the state switching switch 50 in the first state.

It should be noted that when the state switching switch 50 is in the first state and the human finger 2 presses the surface skin layer 15, a distance between the first electrode 11 and the one of the second electrodes 12a to 12h decreases, so electrostatic capacitance of the electrostatic capacitive sensor 1 increases. Therefore, an electric current flowing through the electrostatic capacitive sensor 1 increases. As a result, an electric current flowing through the ammeter 30 also increases. The value detected by the ammeter 30 with the state switching switch 50 in the first state is used to detect whether the human finger 2 has contacted the surface skin layer 15 or not, but is not used to detect whether the human finger has applied pressing force or not.

(6. Detection of Pressing Force Application in Second State)

Figure 5:
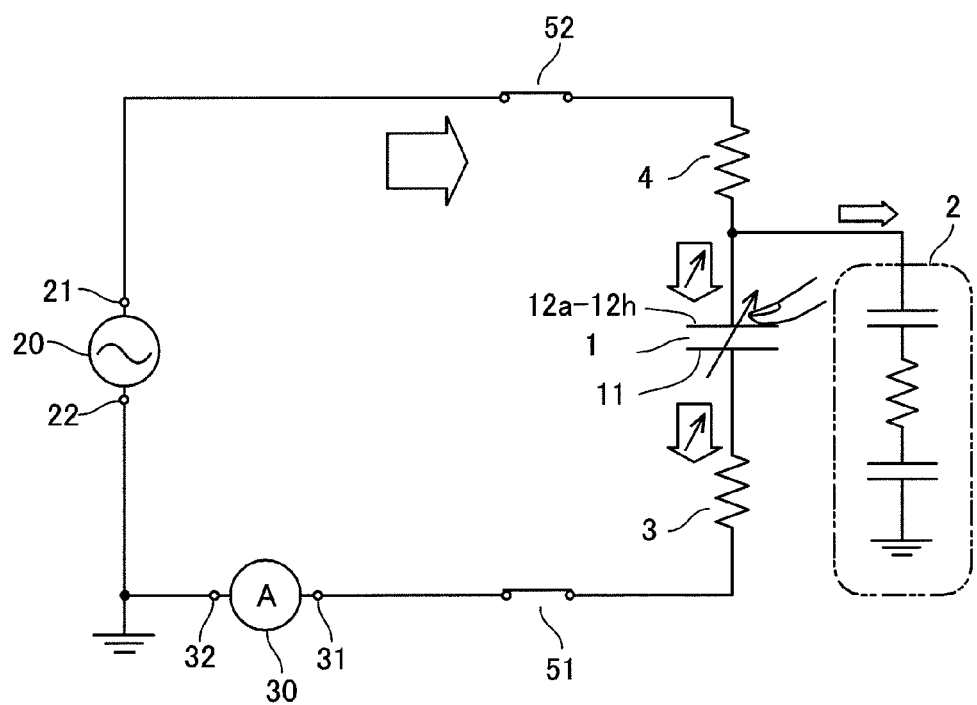
FIG. 5 shows an equivalent circuit of the input state detection device when a state switching switch is in a second state.

Next, we will consider a case in which the state switching switch 50 is in the second state and the human finger 2 as the object has applied pressing force to the surface skin layer 15. A circuit in this case is shown in FIG. 5. That is to say, a cyclic constant voltage is applied to the side of the one of the second electrodes 12a to 12h by the constant-voltage power supply device 20. On the other hand, the first electrode 11 is connected to the detection terminal 31 of the ammeter 30 by way of the resistance 3. Then, the human finger 2 is connected between the electrostatic capacitive sensor 1 and the voltage application terminal 21 of the constant-voltage power supply device 20. That is to say, an equivalent circuit of the human finger 2 is connected in parallel to a series circuit of the electrostatic capacitive sensor 1, the ammeter 30 and the resistance 3.

In this case, an electric current supplied by the constant-voltage power supply device 20 is branched into the route of the electrostatic capacitive sensor 1, the resistance 3 and the ammeter 30 and the route of the equivalent circuit of the human finger 2. However, since the constant-voltage power supply device 20 is used and the electrostatic capacitive sensor 1 and the human finger 2 are connected in parallel to each other, the constant voltage power supply device 20 supplies an electric current such that an electric current flowing into the route of the electrostatic capacitive sensor 1 can keep original intensity by compensating for intensity of an electric current flowing into the equivalent circuit of the human finger 2. Therefore, even when the state switching switch 50 is in the second state and the human finger 2 has contacted the surface skin layer 15, this hardly affects the electric current flowing into the route of the electrostatic capacitive sensor 1.

On the other hand, since the distance between the first electrode 11 and the one of the second electrodes 12a to 12h is decreased by pressing force applied by the human finger 2, electrostatic capacitance of the electrostatic capacitive sensor 1 changes. Specifically speaking, electrostatic capacitance increases with an increase in pressing force. That is to say, as electrostatic capacitance of the electrostatic capacitive sensor 1 increases, the electric current flowing in the route of the electrostatic capacitive sensor 1, the resistance 3 and the ammeter 30 increases. That is to say, when the state switching switch 50 is in the second state, the value detected by the ammeter 30 increases with an increase in pressing force.

As described above, when the state switching switch 50 is in the second state and the human finger 2 as the object has applied pressing force to the surface skin layer 15, the value detected by the ammeter 30 varies with magnitude of pressing force. Therefore, the input detector 70 detects whether the human finger 2 has applied pressing force to the surface skin layer 15 or not based on the value detected by the ammeter 30 with the state switching switch 50 in the second state. That is to say, the input detector 70 detects whether the human finger is in a contact but not pressing state or in a pressing state with respect to the surface skin layer 15 when the state switching switch 50 is in the second state. Furthermore, the input detector 70 detects the magnitude of pressing force applied to the surface skin layer 15.

It should be noted that when the state switching switch 50 is in the second state and the human finger 2 has only contacted the surface skin layer 15 but not applied pressing force to the surface skin layer 15, an electric current flowing into the side of the electrostatic capacitive sensor 1 hardly changes. Therefore, the value detected by the ammeter 30 with the state switching switch 50 in the second state is used for detecting whether the human finger 2 has applied pressing force to the surface skin layer 15 or not, but is not used for detecting whether the human finger 2 has contacted the surface skin layer 15 or not.

(7. Operations of the Controller)

Figure 6:
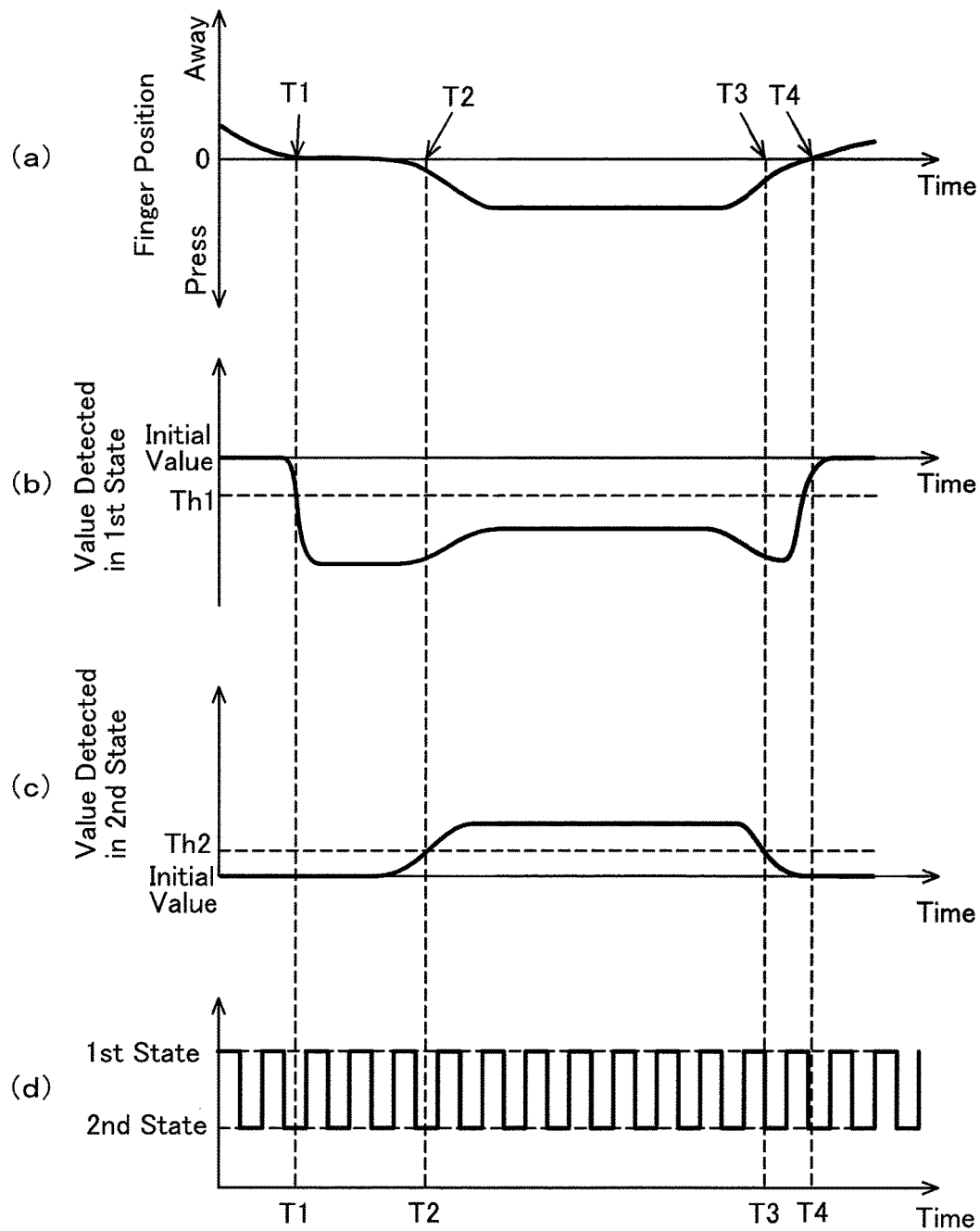

Next, timings of switching of the first switch 51 and the second switch 52 of the state switching switch 50 by the controller 60 will be described with reference to FIG. 6.

FIG. 6(a) shows a tip position of a human finger 2. It is assumed that the human finger 2 approaches the surface skin layer 15 of the electrostatic capacitive sensor unit 10 (before time T1), and contacts the surface skin layer 15 (between time T1 and T2), and then presses the surface skin layer 15 (between T2 and T3) and after that, does not contact the surface skin layer 15 (after T4). In this case, when the state switching switch 50 is in the first state, an electric current flowing into the ammeter 30 shows a behavior shown in FIG. 6(b), and when the state switching switch 50 is in the second state, an electric current flowing into the ammeter 30 shows a behavior shown in FIG. 6(c).

However, since the first state and the second state can be switched, FIG. 6(b) shows an electric current flowing into the ammeter 30 on an assumption that the first state is continued. Similarly, FIG. 6(c) shows an electric current flowing into the ammeter 30 on an assumption that the second state is continued. Therefore, FIGS. 6(b), 6(c) do not show electric currents actually detected by the ammeter 30.

As shown in FIG. 6(b), the value detected by the ammeter 30 with the state switching switch 50 in the first state decreases in a moment when the human finger 2 changes from the non-contact state to the contact state with respect to the surface skin layer 15, slightly increases as the human finger 2 changes from the contact but not pressing state to the pressing state, slightly decreases in a moment when the human finger 2 changes from the pressing state to the contact but not pressing state, and increases as the human finger 2 changes from the contact but not pressing state to the non-contact state, thereby returning to an initial value.

On the other hand, as shown in FIG. 6(c), the value detected by the ammeter 30 with the state switching switch 50 in the second state hardly changes when the human finger 2 is in the non-contact state or in the contact but not pressing state. Therefore, the value detected by the ammeter 30 at this time is defined as a reference value. Subsequently, when the human finger 2 changes from the constant but not pressing state and applies pressing force to the surface skin layer 15, the value detected by the ammeter 30 increases with an increase in magnitude of pressing force. Here, a difference between the value detected by the ammeter 30 and the reference value corresponds to the magnitude of pressing force. Subsequently, when the pressing force becomes zero and the human finger 2 changes from the pressing state to the non-contact state, the value detected by the ammeter 30 returns to the initial value (corresponding to the reference value).

The position of the tip of the human finger 2, the value detected by the ammeter 30 with the state switching switch 50 in the first state, and the value detected by the ammeter 30 with the state switching switch 50 in the second state change as mentioned above. In this case, timings of switching of the switches 51, 52 of the state switching switch 50 by the controller 60 are as follows.

The switch timings of the switches 51, 52 are as shown in FIG. 6(d). That is to say, the controller 60 periodically switches the switches 51, 52 of the state switching switch 50 between the first state and the second state. Each cycle is set to be sufficiently shorter than average time which it takes for a human finger 2 to contact the surface skin layer 15 and then stop contacting the surface skin layer 15.

At this time, the input detector 70 periodically detects whether the human finger 2 as the object is in the non-contact state or in the contact but not pressing state with respect to the surface skin layer 15 when the state switching switch 50 is in the first state, and whether the human finger 2 is in the contact but not pressing state or in the pressing state when the state switching switch 50 is in the second state. Of course, when the state switching switch 50 is in the second state, the input detector 70 also detects the magnitude of pressing force.

Specifically, the input detector 70 detects that the human finger 2 has changed from the non-contact state to the contact but not pressing state with respect to the surface skin layer 2 by determining that the value detected by the ammeter 30 is smaller than a first threshold value Th1 when the state switching switch 50 is in the first state. In FIG. 6(d), when the state switching switch 50 is in the first state slightly after time T1, the input detector 70 detects that the human finger 2 has contacted the surface skin layer 15.

Then, the input detector 70 detects that the human finger 2 has changed from the contact but not pressing state to the pressing state with respect to the surface skin layer 15 by determining that the value detected by the ammeter 30 is greater than a second threshold value Th2 when the state switching switch 50 is in the second state. In FIG. 6(d), since the state switching switch 50 is in the second state at time T2, at time T2 the input detector 70 detects that the human finger 2 has applied pressing force to the surface skin layer 15. Furthermore, when the state switching switch 50 is in the second state, the input detector 70 also detects magnitude of pressing force.

Furthermore, the input detector 70 detects that the human finger 2 has changed from the pressing state to the contact but not pressing state with respect to the surface skin layer 15 by determining that the value detected by the ammeter 30 is smaller than the second threshold value Th2 when the state switching switch 50 is in the second state. In FIG. 6(d), around time T3 the input detector 70 detects that the human finger 2 has stopped applying pressing force to the surface skin layer 15.

Moreover, the input detector 70 detects that the human finger 2 has changed from the contact but not pressing state to the non-contact state with respect to the surface skin layer 15 by determining that the value detected by the ammeter 30 is greater than the first threshold value Th1 when the state switching switch 50 is in the first state. In FIG. 6(d), when the state switching switch 50 is in the first state slightly after time T4, the input detector 70 detects that the human finger 2 has changed to the non-contact state with respect to the surface skin layer 15.

In summary, since the input detector 70 alternately carries out detection of contact of the human finger 2 and detection of pressing force application by the human finger 2, the input state detection device can detect pressing by the human finger 2 at an early stage. Moreover, the input state detection device can detect that the human finger 2 has changed from the state of pressing the second electrodes 12a to 12h to separation from the second electrodes 12a to 12h.

Second Embodiment

An input state detection device of the second embodiment will be described with reference to FIGS. 7 and 8. The input state detection device of this embodiment is different from that of the first embodiment in a controller 160 and an input detector 170. Other constituent elements are assigned with the same reference numerals to those of the first embodiment and their description will be omitted.

Figure 7:
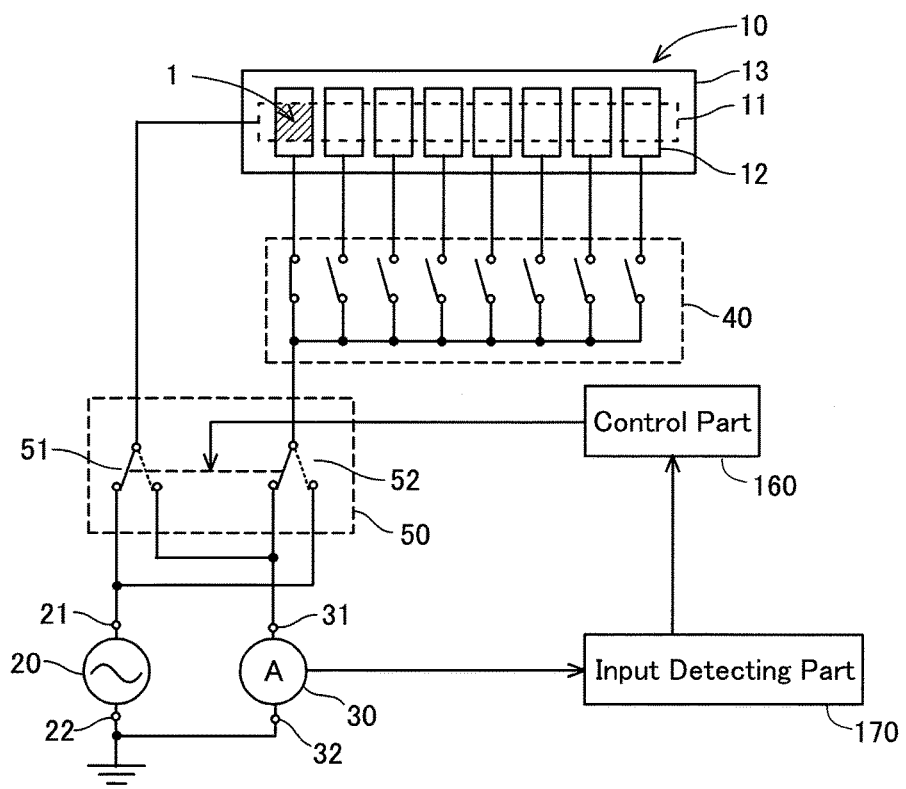
FIG. 7 shows configuration of an input state detection device in a second embodiment.

As shown in FIG. 7, the controller 160 retrieves a change in a non-contact state, a contact but not pressing state and a pressing state based on determination by the input detector 170. Then, the controller 160 controls switch operations of a first switch 51 and a second switch 52 of a state switching switch 50 based on information retrieved from the input detector 170. The state switching switch 50 is put in any one of a first mode, a second mode and a third mode to be described below by the controller 160. The first mode is a mode for causing the state switching switch 50 to keep the first state. The second mode is a mode for causing the state switching switch to keep the second state. The third mode is a mode for causing the state switching switch to alternately and periodically switch the first state and the second state.

Operations by the controller 160 and detection of the respective states by the input detector 170 will be described with reference to FIG. 8. Here, a tip position of a human finger 2 (FIG. 8(a)), a value detected by the ammeter 30 with the state switching switch 50 in the first state (FIG. 8(b)), and a value detected by the ammeter 30 with the state switching switch 50 in the second state (FIG. 8 (c)) show almost the same behaviors as those of the first embodiment. Therefore, time T1 to T4 in FIG. 8 have similar meanings to T1 to T4 of the first embodiment in FIG. 6.

Figure 8:
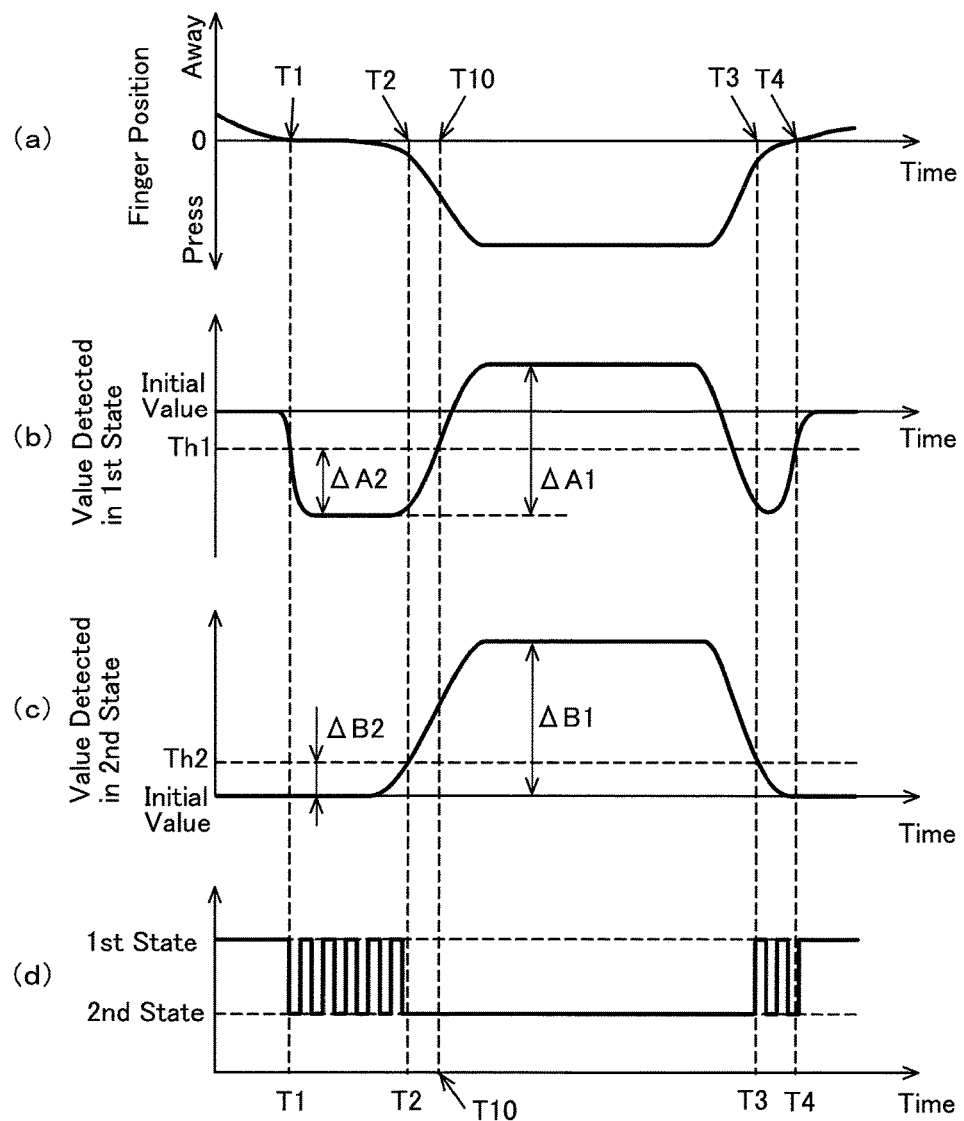
FIG. 8 includes FIGS. 8(a)-8(d) which show timings of switching by a control device in the second embodiment.

However, since pressing force applied on a surface skin layer 15 by the human finger 2 is great as indicated between T2 and T3 in FIG. 8, the tip position of the human finger 2, the value detected by the ammeter 30 with the state switching switch 50 in the first state, and the value detected by the ammeter 30 with the state switching switch 50 in the second state more greatly change than those of the first embodiment.

Here, as shown in FIG. 8(b), a difference between the value detected by the ammeter 30 with the state switching switch 50 in the first state when the human finger 2 is in a contact but not pressing state (a minimum value between T1 and T2) and the value detected by the ammeter 30 with the state switching switch 50 in the first state when the human finger 2 is in a pressing state (a maximum value between T2 and T3) is defined as ΔA1. Moreover, as shown in FIG. 8(b), a difference between the value detected by the ammeter 30 when the human finger 2 is in the contact but not pressing state and the state switching switch 50 is in the first state (the minimum value between T1 and T2) and a first threshold value Th1 is defined as ΔA2.

On the other hand, as shown in FIG. 8(c), a difference between the value detected by the ammeter 30 with the state switching switch 50 in the second state when the human finger 2 is in the contact but not pressing state (a minimum value between T1 and T2) and the value detected by the ammeter 30 with the state switching switch 50 in the second state when the human finger 2 is in the pressing state (a maximum value between T2 and T3) is defined as ΔB1. Moreover, as shown in FIG. 8(c), a difference between the value detected by the ammeter 30 with the state switching switch 50 in the second state when the human finger 2 is in the contact but not pressing state (the minimum value between T1 and T2) and a second threshold value Th2 is defined as ΔB2.

The first threshold value Th1 and the second threshold value Th2 are set to satisfy a formula (1). That is to say, the first threshold value Th1 and the second threshold value Th2 are set so that a ratio of ΔA2 to ΔA1 is greater than a ratio of ΔB2 to ΔB1.

[Math. 1]

$$\frac{\Delta A2}{\Delta A1} > \frac{\Delta B2}{\Delta B1} \quad (1)$$

Therefore, when the human finger 2 changes from the contact but not pressing state to the pressing state, time T2 when the value detected by the ammeter 30 with the state switching switch 50 in the second state exceeds the second threshold value Th2 is earlier than time T10 when the value detected by the ammeter 30 with the state switching switch 50 in the first state exceeds the first threshold value Th1. Here, in order to satisfy the above relation, simply the first threshold value Th1 and the second threshold value Th2 are set as follows. That is to say, the first threshold value Th1 and the second threshold value Th2 are set so that the difference ΔA2 between the value detected by the ammeter 30 with the state switching switch 50 in the first state when the human finger 2 is in the contact but not pressing state, and the first threshold value Th1 is greater than the difference ΔB2 between the value detected by the ammeter 30 with the state switching switch 50 in the second state when the human finger 2 is in the contact but not pressing state, and the second threshold value Th2.

As shown before time T1 in FIG. 8(d), the controller 160 puts the state switching switch 50 in the first mode as an initial state, i.e., when the input detector 170 determines that the human finger 2 is in the non-contact state. Here, the input detector 170 determines that the human finger 2 changes from the non-contact state to the contact but not pressing state, from the value detected by the ammeter 30 with the state switching switch 50 in the first state in the first mode being smaller than the first threshold value Th1. Therefore, as understood from the FIG. 8(b), at time T1 the input detector 170 determines that the human finger 2 has changed from the non-contact state to the contact but not pressing state.

Then, as shown in FIG. 8(d), the controller 160 switches the state switching switch 50 from the first mode to the third mode at time T1. That is to say, the state switching switch 50 can alternately and periodically switch the first state and the second state. When the state switching switch 50 is in the third mode, the input detector 170 detects whether the human finger 2 changes from the contact but not pressing state to the pressing state or from the contact but not pressing state to the non-contact state.

Subsequently, it is assumed that as shown in FIG. 8(a), the human finger 2 changes from the contact but not pressing state to the pressing state with respect to the surface skin layer 15 at time T2. Then, as shown around time T2 in FIGS. 8(b), 8(c), the value detected by the ammeter 30 with the state switching switch 50 in the first state increases, and the value detected by the ammeter 30 with the state switching switch 50 in the second state also increases.

However, the first threshold value Th1 and the second threshold value Th2 are set to satisfy the formula (1) as mentioned above. Therefore, when the human finger 2 changes from the contact but not pressing state to the pressing state, time T2 when the value detected by the ammeter 30 with the state switching switch 50 in the second state exceeds the second threshold value Th2 is earlier than time T10 when the value detected by the ammeter 30 with the state switching switch 50 in the first state exceeds the first threshold value Th1. The input detector 170 determines that the human finger 2 changes from the contact but not pressing state to the pressing state from the value detected by the ammeter 30 with the state switching switch 50 in the second state in the third mode being greater than the second threshold value Th2. Therefore, as understood from FIG. 8(c), at time T2 the input detector 170 determines that the human finger 2 has changed from the contact but not pressing state to the pressing state.

Then, as shown in FIG. 8(d), the controller 160 switches the state switching switch 50 from the third mode to the second mode at time T2. That is to say, the state switching switch 50 keeps the second state. When the state switching switch 50 is in the second mode, the input detector 170 detects that the human finger 2 changes from the pressing state to the contact but not pressing state.

Subsequently, as shown in FIG. 8(a), it is assumed that the human finger 2 changes from the pressing state to the contact but not pressing state with respect to the surface skin layer 15 at time T3. In this case, as indicated around time T3 in FIG. 8(c), the value detected by the ammeter 30 with the state switching switch 50 in the second state decreases. Here, the input detector 170 determines that the human finger 2 changes from the pressing state to the contact but not pressing state from the value detected by the ammeter 30 with the state switching switch 50 in the second state in the second mode being smaller than the second threshold value Th2. Therefore, as understood from FIG. 8(c), at time T3 the input detector 170 determines that the human finger 2 has changed from the pressing state to the contact but not pressing state.

Then, as shown in FIG. 8(d), the controller 160 switches the state switching switch 50 from the second mode to the third mode at time T3. That is to say, the state switching switch 50 alternately and periodically switches the first state and the second state again.

Subsequently, as shown in FIG. 8(a), it is assumed that the human finger 2 changes from the contact but not pressing state to the non-contact state with respect to the surface skin layer 15 at time T4. In this case, as indicated around time T4 in FIG. 8(b), the value detected by the ammeter 30 with the state switching switch 50 in the first state increases. On the other hand, as indicated around time T4 in FIG. 8(c), the value detected by the ammeter 30 with the state switching switch 50 in the second state does not change.

The input detector 170 determines that the human finger 2 changes from the contact but not pressing state to the non-contact state from the value detected by the ammeter 30 with the state switching switch 50 in the first state in the third mode being greater than the first threshold value Th1. Therefore, as understood from FIG. 8(b), at time T4 the input detector 170 determines that the human finger 2 has changed from the contact but not pressing state to the non-contact state.

Then, as shown in FIG. 8(d), the controller 160 switches the state switching switch 50 from the third mode to the first mode at time T4. That is to say, the state switching switch 50 keeps the first state. In such a situation, the input detector 170 detects again that the human finger 2 changes from the non-contact state to the contact but not pressing state.

The input detector 170 can reliably detect that the object has changed from the non-contact state to the contact but not pressing state by putting the state switching switch 50 in the first mode for keeping the first state when the human finger 2 is in the non-contact state as mentioned above. Moreover, when magnitude of pressing force is to be detected, the input detector 170 can detect the magnitude of pressing force with a high precision by putting the state switching switch 50 in the second mode for keeping the second state when the human finger 2 is in the pressing state.

However, it is not easy to determine when to change from the first mode to the second mode and when to change from the second mode to the first mode. Therefore, the change between the first mode and the second mode is carried out via the third mode. The third mode is a mode of alternately and periodically switching the first state and the second state. That is to say, when the state switching switch 50 is in the third mode, the state switching switch 50 can smoothly change to the first mode for keeping the first state and can also smoothly change to the second mode for keeping the second state.

Furthermore, the input detector 170 can reliably determine a change in the input state by the human finger 2 by using the first threshold value Th1 or the second threshold value Th2 in each mode. Therefore, the controller 160 can appropriately switch these modes. Furthermore, the first threshold value Th1 and the second threshold value Th2 are set as above. Accordingly, when the human finger 2 is in the contact but not pressing state, the controller 160 can reliably detect whether the object has changed to the non-contact state or to the pressing state. As a result, when the state switching switch 50 is in the third mode, the controller 160 can reliably determine whether the state switching switch should be switched to the first mode or the second mode.

Third Embodiment

Operations of a controller 160 of an input state detection device of the third embodiment will be described with reference to FIG. 9. The input state detection device of this embodiment has substantially the same configuration as that of the second embodiment.

Here, the controller 160 controls switch operations of a first switch 51 and a second switch 52 of a state switching switch 50 based on information retrieved from an input detector 170. However, the controller 160 puts the state switching switch 50 in either one of a first mode for keeping a first state and a second mode for keeping a second state. It is assumed that a tip position of a human finger 2, a value detected by an ammeter 30 with the state switching switch 50 in the first state, and a value detected by the ammeter 30 with the state switching switch 50 in the second state in this embodiment exhibit the same behaviors as those of the first embodiment shown in FIGS. 6(a) to 6(c).

The operations of the controller 160 will be described with reference to FIG. 9. As indicated before time T1 in FIG. 9, the controller 160 puts the state switching switch 50 in the first mode as an initial state, i.e., when the input detector 170 determines that a human finger 2 is in a non-contact state. Here, the input detector 170 determines that the human finger 2 changes from the non-contact state to a contact but not pressing state from the value detected by the ammeter 30 with the state switching switch 50 in the first state in the first mode being smaller than a first threshold value Th1.

Figure 9:
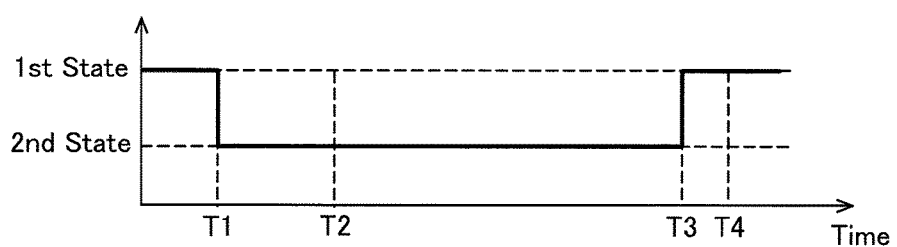
FIG. 9 shows timings of switching by a control device in a third embodiment.

At time T1 in FIG. 9, the input detector 170 detects that the human finger 2 has changed from the non-contact state to the contact but not pressing state with respect to a surface skin layer 15. Specifically, the input detector 170 detects that the human finger 2 has contacted the surface skin layer 15 by determining that the value detected by the ammeter 30 with the state switching switch 50 in the first state is smaller than the first threshold value Th1.

The controller 160 switches the switches 51, 52 of the state switching switch 50 from the first mode to the second mode at a timing when the controller 160 determines that the human finger 2 has contacted the surface skin layer 15. In such a situation, the input detector 170 detects that the human finger 2 has changed from the contact but not pressing state to a pressing state with respect to the surface skin layer 15 and also detects magnitude of pressing force when the human finger 2 is in the pressing state. Specifically, the input detector 170 detects that the human finger 2 has applied pressing force to the surface skin layer 15 by determining that the value detected by the ammeter 30 is greater than the second threshold value Th2 when the state switching switch 50 is in the second state. In FIG. 9, at time T2 the input detector 170 detects that the human finger 2 has applied pressing force to the surface skin layer 15.

Subsequently, when the pressing force applied by the human finger 2 decreases, the input detector 170 determines whether the value detected by the ammeter 30 with the state switching switch 50 in the second state is smaller than a second threshold value Th2 or not. Upon determining that the detected value is smaller than the second threshold value Th2, the input detector 170 determines that the pressing force applied on the surface skin layer 15 by the human finger 2 has substantially disappeared and that the human finger 2 is simply in contact with the surface skin layer 15. That is to say, at time T3 the input detector 170 detects that the human finger 2 has changed from the pressing state to the contact but not pressing state. At this timing, the controller 160 switches the switches 51, 52 of the state switching switch 50 from the second mode to the first mode. In FIG. 9, at time T3 the input detector 170 detects that the human finger 2 has stopped applying pressing force to the surface skin layer 15.

Then the input detector 170 detects that the human finger has changed from the contact but not pressing state to the non-contacting state with respect to the surface skin layer 15 by determining that the value detected by the ammeter 30 is greater than the first threshold value Th1 after the state switching switch 50 is switched to the first mode. In FIG. 9, at time T4 the input detector 170 detects that the human finger 2 has changed to the non-contact state with respect to the surface skin layer 15.

Then, the control unit 160 puts the state switching switch 50 in the first mode until a human finger 2 changes from the non-contact state to the contact but not pressing state with respect to the surface skin layer 2 again. Thus the input detector 170 can reliably detect contact and pressing of the human finger 2 on the surface skin layer 15. In this case, the number of switch operations of the state switching switch 50 can be decreased and consumption energy can be reduced.

Fourth Embodiment

Figure 10:
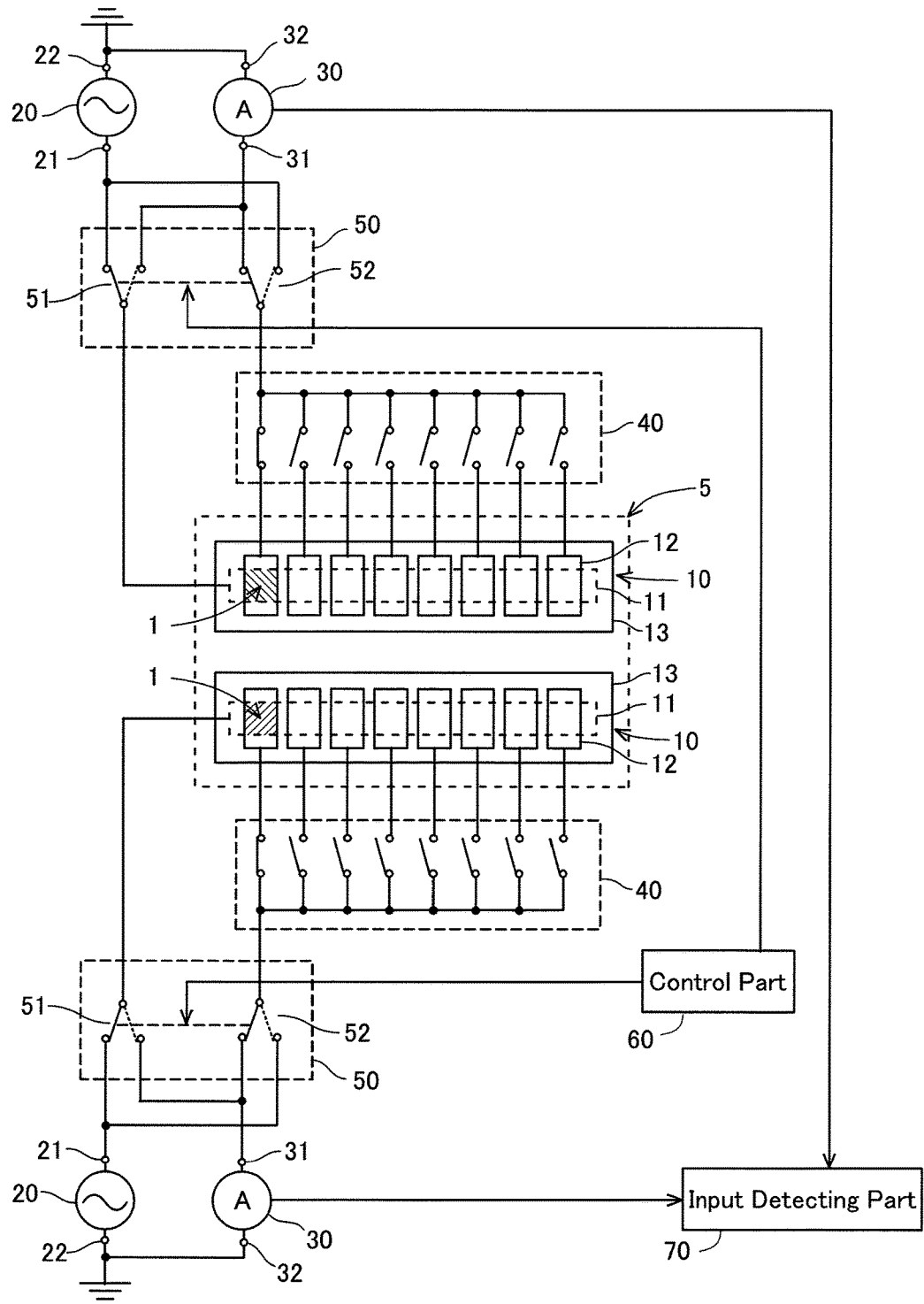
FIG. 10 shows configuration of an input state detection device in a fourth embodiment.

The plurality of electrostatic capacitive sensors 1 are arranged in a row in the first to third embodiments. As shown in FIG. 10, an input state detection device of the fourth embodiment comprises a plurality of electrostatic capacitive sensor units 10, 10 and a plurality of constant-voltage power supply devices 20,20, a plurality of ammeters 30, 30, a plurality of electrode switching devices 40, 40, a plurality of state switching switches 50, 50 corresponding to the plurality of electrostatic capacitive sensor units 10, 10, respectively and a common controller 60 and a common input detector 70.

A detection range 5 is a range including the plurality of electrostatic capacitive sensor units 10, 10. Therefore, the input state detection device can detect that a human finger 2 is in a non-contact state, a contact but not pressing state, or a pressing state with respect to a surface skin layer 15 over a wide range.

Fifth Embodiment

In the above embodiments, the input state detection devices detect whether the human finger 2 is in the non-contact state, in the contact but not pressing state, or in the pressing state by detecting an electric current flowing through the detection terminal 31 by using the ammeter 30. Besides, an input state detection device can detect input states by detecting potential of a detection terminal 231 by using the following detector 230.

(Configuration of Input State Detection Device)

Figure 11:
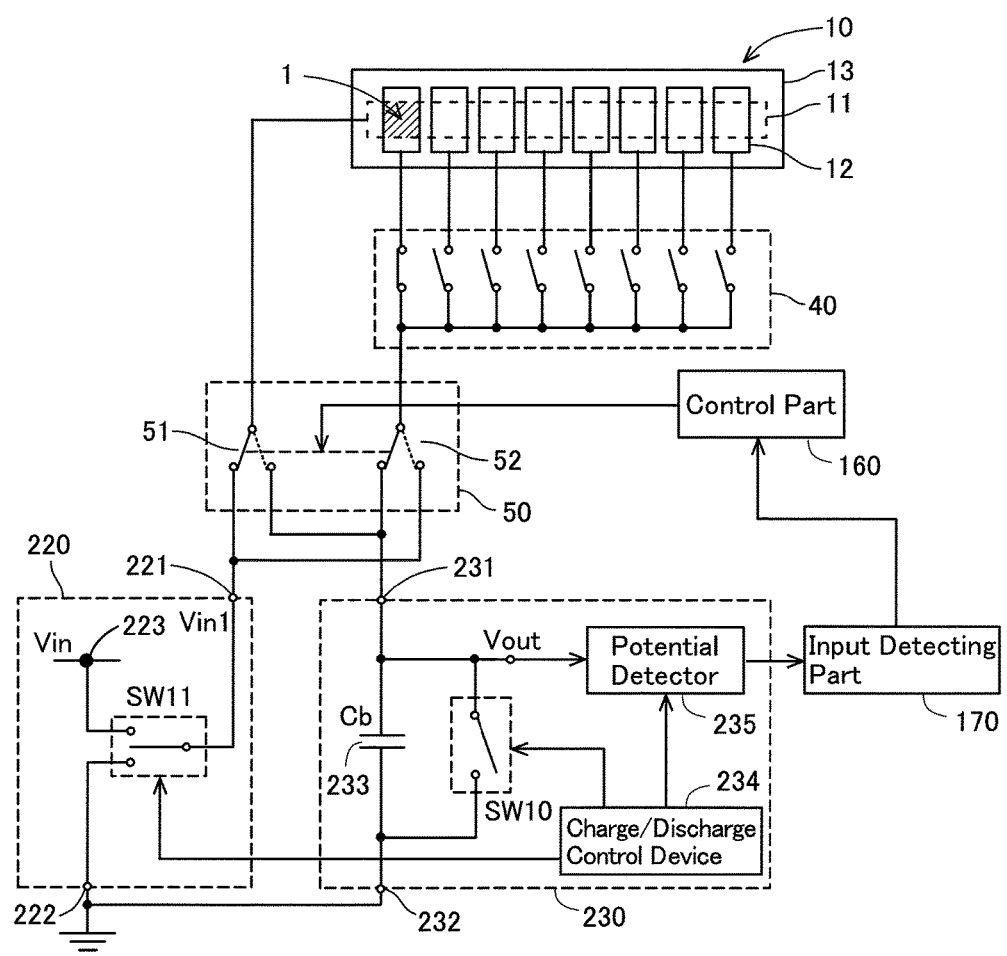
FIG. 11 shows configuration of an input state detection device in a fifth embodiment.

The input state detection device using the detector 230 will be described with reference to FIG. 11. The input state detection device comprises an electrostatic capacitive sensor unit 10, a constant-voltage power supply device 220, the detector 230, an electrode switching device 40, a state switching switch 50, a controller 160, and an input detector 170. Here, constitutional elements of this embodiment other than the constant-voltage power supply device 220 and the detector 230 are the same as those of the first or second embodiment assigned with the same reference numerals.

The constant-voltage power supply device 220 comprises a constant-voltage power source 223 and an input switching element SW11. The constant-voltage power source 223 is a power source capable of applying an input voltage $V_{in}$, which is a constant voltage. A voltage application terminal 221, which is one end of the input switching element SW11, is connected to a side of electrostatic capacitive sensors 1. The other end of the input switching element SW11 is switchably connected to either one of the constant-voltage power source 223 and an earth terminal 222 on a ground potential side. That is to say, when the input switching element SW11 is connected to the constant-voltage power source 223, the input voltage $V_{in}$ is applied to one of the electrostatic capacitive sensors 1. On the other hand, when the input switching element SW11 is connected to the ground potential, the input voltage $V_{in}$ is not applied to the one of the electrostatic capacitive sensors 1.

The detector 230 comprises abridge capacitor 233, a charge and discharge switching element SW10, a charge and discharge control device 234 and a potential detector 235. The bridge capacitor 233 is connected in series with the other side of the one of the electrostatic capacitive sensors 1 (a different side from the constant voltage power supply device 220) and connected between the one of the electrostatic capacitive sensors 1 and the ground potential. That is to say, the one of the electrostatic capacitive sensors 1 and the bridge capacitor 233 constitute a bridge circuit. Here, the bridge capacitor 233 has electrostatic capacitance Cb.

The charge and discharge switching element SW10 is connected in series with the other side of the one of the electrostatic capacitive sensors 1, while connected in parallel to the bridge capacitor 233. Moreover, when closed, the charge and discharge switching element SW10 discharges an electric charge of the other side of the one of the electrostatic capacitive sensors 1 to ground potential.

The charge and discharge control device 234 alternately performs a discharging step and a charging step to be mentioned below. That is to say, the charge and discharge control device 234 discharges an electric charge of the one of the electrostatic capacitive sensors 1 to the ground potential by connecting the input switching element SW11 to the ground potential and closing the charge and discharge switching element SW10 (a discharging step). Here, connecting the input switching element SW11 to the ground potential corresponds to not applying the input voltage $V_{in}$ to the one of the electrostatic capacitive sensors 1. The one of the electrostatic capacitive sensors 1 can be calibrated by setting its electric charge to the ground potential as a reference by the above discharge step.

Moreover, the charge and discharge control device 234 charges the one of the electrostatic capacitive sensors 1 by connecting the input switching element SW11 to the constant-voltage power source 223 and opening the charge and discharge switching element SW10 after the above discharging step (a charging step). Here, connecting the input switching element SW11 to the constant-voltage power source 223 corresponds to applying the input voltage $V_{in}$ to the one of the electrostatic capacitive sensors 1.

When the charge and discharge control device 234 performs the charging step, the potential detector 235 detects potential $V_{out}$ between the one of the electrostatic capacitive sensors 1 and the bridge capacitor 233 (hereinafter also referred to as "output potential"). It should be noted that the output potential $V_{out}$ corresponds to potential of the other side of the one of the electrostatic capacitive sensors 1.

(Equivalent Circuit in Non-Contact State)

Figure 12:
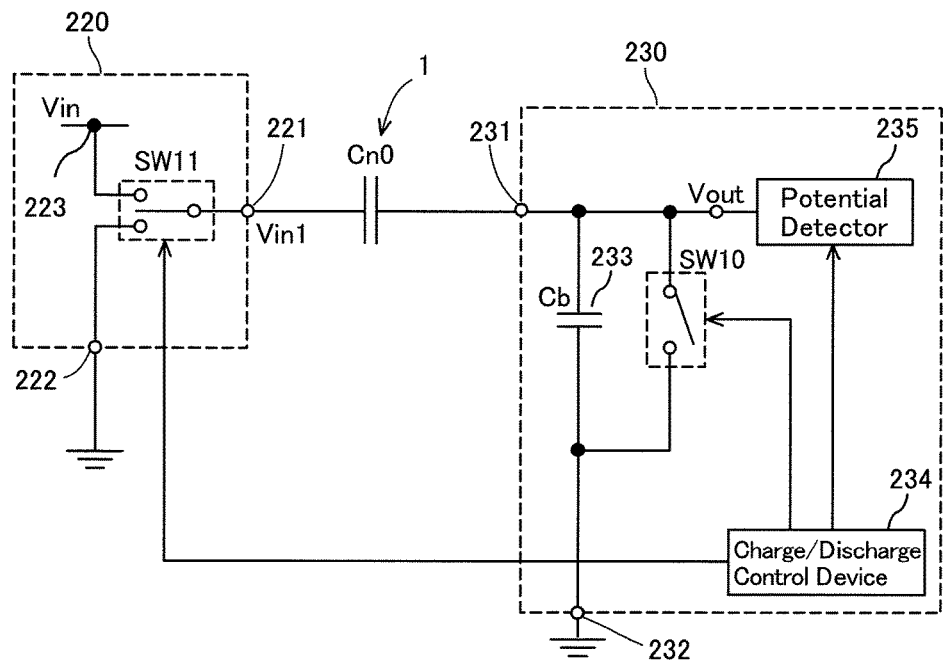
FIG. 12 shows an equivalent circuit of an input state detection device when a human finger as an object is in a non-contact state with respect to an electrostatic capacitive sensor.

When the human finger 2 is in the non-contact state with respect to the surface skin layer 15, an equivalent circuit of the input state detection device is as shown in FIG. 12. When the input switching element SW11 is connected to the constant-voltage power source 223, output potential $V_{out0}$ is expressed by a formula (2) using electrostatic capacitance Cn0 of one electrostatic capacitive sensor 1, electrostatic capacitance Cb of the bridge capacitor 233 and an input voltage $V_{in}$.

[Math. 2]

$$Vout0 = \frac{Cn0}{Cn0 + Cb} \times Vin \quad (2)$$

Here, the electrostatic capacitance Cb of the bridge capacitor 233 and the input voltage $V_{in}$ are known. Therefore, according to the formula (2), the output potential $V_{out0}$ detected by the potential detector 235 is a value corresponding to the electrostatic capacitance of the electrostatic capacitive sensor 1.

(Operations of Charge and Discharge Control Device)

Figure 13:
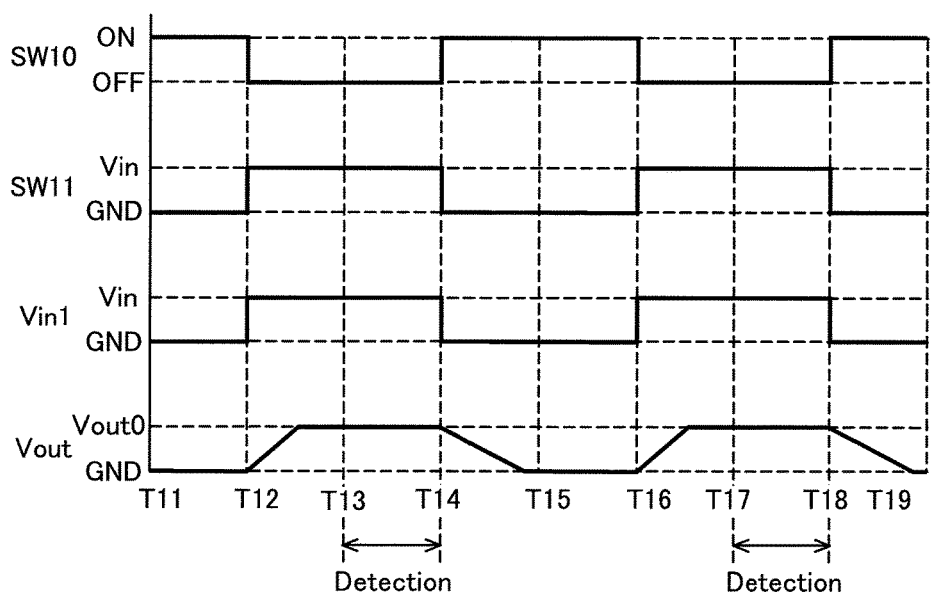
FIG. 13 is a timing chart of operations of switching elements SW10, SW11, potential $V_{in1}$ of one side and output potential $V_{out}$ of an electrostatic capacitive sensor in the fifth embodiment.

Next, when the human finger 2 is in the non-contact state with respect to the surface skin layer 15, a relation between timings of opening and closing the charge and discharge switching element SW10 by the charge and discharge control device 234 and potential $V_{in1}$ of one side and output potential $V_{out}$ of the electrostatic capacitive sensor 1 will be described with reference to FIG. 13. The charge and discharge switching element SW10 is on (closed) between time T11 and T12. Moreover, the input switching element SW11 is connected to ground potential. Therefore, potential $V_{in1}$ of one side of the electrostatic capacitive sensor 1 becomes ground potential.

Owing to the above operations, an electric charge of the electrostatic capacitive sensor 1 is discharged via the charge and discharge switching element SW10. As a result, the output potential $V_{out}$ between the electrostatic capacitive sensor 1 and the bridge capacitor 233 becomes ground potential as a reference. That is to say, the output potential $V_{out}$ is unstable before the above operations, but owing to the above operations, the output potential $V_{out}$ is set to ground potential.

Subsequently, between time T12 and T14, the charge and discharge switching element SW10 is off (opened) and the input switching element SW11 is connected to the constant-voltage power source 223. Therefore, potential $V_{in1}$ of one side of the electrostatic capacitive sensor 1 becomes an input voltage $V_{in}$. Owing to the above operation, an electric charge is charged to the electrostatic capacitive sensor 1. After time required for charging passes (between time T13 and T14 in FIG. 13), the potential detector 235 detects the output potential $V_{out}$. The output potential $V_{out}$ detected by the potential detector 235 is output potential $V_{out0}$ which is a detection target.

Next, between time T14 and T15, the charge and discharge switching element SW10 is on (closed) and the input switching element SW11 is connected to the ground potential. Owing to this operation, potential $V_{in1}$ of one side of the electrostatic capacitive sensor 1 becomes ground potential and the electric charge of the electrostatic capacitive sensor 1 is discharged. That is to say, the abovementioned output potential $V_{out}$ becomes ground potential. Subsequently, similar operations to those of Time T11 to T15 are repeated between T15 and T19.

As mentioned above, the bridge capacitor 233 is connected in series with the electrostatic capacitive sensor 1 and the potential detector 235 detects potential of the other side of the electrostatic capacitive sensor 1, i.e., output potential $V_{out}$ between the electrostatic capacitive sensor 1 and the bridge capacitor 233. Here, since intermediate potential between mere two capacitors is not constant, electrostatic capacitance detected by using the intermediate potential is not highly accurate.

However, the electric charge of the electrostatic capacitive sensor 1 is discharged by closing the charge and discharge switching element SW10 as mentioned above. That is to say, output potential $V_{out}$ as the abovementioned intermediate potential becomes ground potential as a reference. That is to say, the output potential $V_{out}$ is calibrated by closing the charge and discharge switching element SW10.

When the charge and discharge switching element SW10 is opened and the input voltage $V_{in}$ is applied to one side of the electrostatic capacitive sensor 1 after the electric discharge, the potential detector 235 detects potential of the other side of the electrostatic capacitive sensor 1. That is to say, the potential detected by the potential detector 235 is potential proportional to electrostatic capacitance Cn0 of the electrostatic capacitive sensor 1.

(Output Potential in Contact but not Pressing State and Pressing State)

Figure 14:
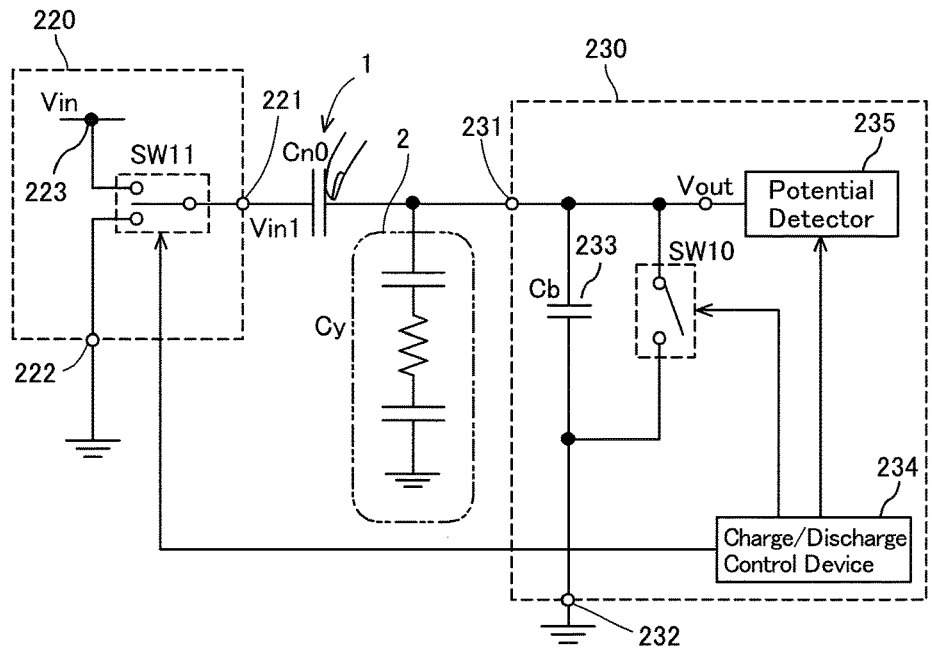
FIG. 14 shows an equivalent circuit of an input state detection device when a state switching switch is in a first state and a human finger as an object is in a contact but not pressing state with respect to the electrostatic capacitive sensor.

When the state switching switch 50 is in the first state and the human finger 2 is in the contact but not pressing state with respect to the surface skin layer 15, an equivalent circuit of the input state detection device is as shown in FIG. 14. Here, for the purpose of convenience it is assumed that the human finger 2 has electrostatic capacitance Cy. When the input switching element SW11 is connected to the constant-voltage power source 223, output potential $V_{out1}$ is expressed by a formula (3) using electrostatic capacitance Cn0 of the electrostatic capacitive sensor 1, electrostatic capacitance Cb of the bridge capacitor 233, an input voltage $V_{in}$, and electrostatic capacitance Cy of the human finger 2. Here, when the human finger 2 is in the contact but not pressing state, the electrostatic capacitance Cn0 of the electrostatic capacitive sensor 1 is substantially constant.

[Math. 3]

$$Vout1 = \frac{Cn0}{Cn0 + Cy + Cb} \times Vin \quad (3)$$

In comparison with the formula (3) and the formula (2), the output potential $V_{out1}$ when the human finger 2 is in the contact but not pressing state is smaller than the output potential $V_{out0}$ when the human finger 2 is in the non-contact state due to an effect of the electrostatic capacitance Cy of the human finger 2. That is to say, the output potential $V_{out0}$, $V_{out1}$ exhibits similar behaviors to the value detected by the ammeter 30 shown in the first to third embodiments.

Figure 15:
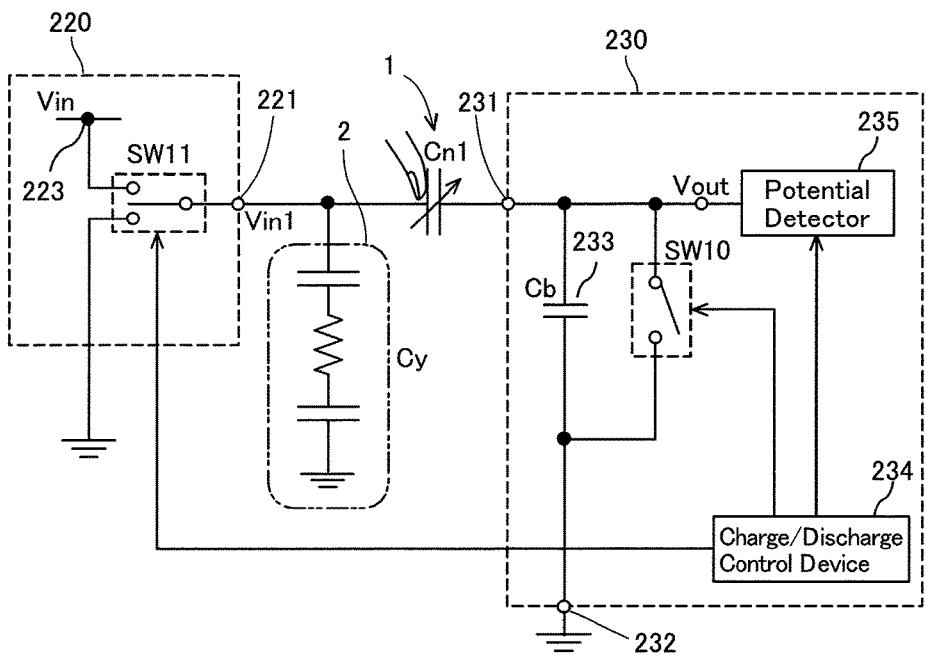
FIG. 15 shows an equivalent circuit of the input state detection device when the state switching switch is in a second state and the human finger as the object is in a pressing state with respect to the electrostatic capacitive sensor.

Moreover, when the state switching switch 50 is in the second state and the human finger 2 is in the pressing state with respect to the surface skin layer 15, an equivalent circuit of the input state detection device is as shown in FIG. 15. When the input switching element SW11 is connected to the constant-voltage power source 223, output potential $V_{out2}$ is expressed by a formula (4) using electrostatic capacitance Cn1 of the electrostatic capacitive sensor 1, electrostatic capacitance Cb of the bridge capacitor 233, an input voltage $V_{in}$, and electrostatic capacitance Cy of the human finger 2. Here, when the human finger 2 is in the pressing state, the electrostatic capacitance Cn1 of the electrostatic capacitive sensor 1 changes with pressing force.

[Math. 4]

$$Vout2 = \frac{Cn1}{Cn1 + Cb} \times Vin \quad (4)$$

Here, the electrostatic capacitance Cn1 when the human finger 2 is in the pressing state is greater than the electrostatic capacitance Cn0 when the human finger 2 is in the contact but not pressing state. Therefore, in comparison with the formula (4) and the formula (3), the output potential $V_{out2}$ when the human finger 2 is in the pressing state is greater than the output potential $V_{out1}$ when the human finger 2 is in the contact but not pressing state due to a change in electrostatic capacitance Cn1 of the electrostatic capacitive sensor 1. That is to say, output potential $V_{out1}$, $V_{out2}$ exhibits similar behaviors to the value detected by the ammeter 30 as shown in Examples 1 to 3. From the above, input states by the human finger 2 can be reliably detected even when the ammeter 30 is replaced with the detector 230.

(Others)

In the above, it is assumed that the input state detection device always performs either detection with the state switching switch in the first state or detection with the state switching switch in the second state. That is to say, the input state detection device continuously performs detection with the state switching switch either in the first state or in the second state. Besides, the input state detection device can intermittently perform detection with the state switching switch either in the first state or in the second state in a predetermined cycle. By doing so, the number of switch operations of the state switching device 50 is further decreased and consumption energy is further decreased.

Moreover, the electrostatic capacitive sensor unit 10 is constituted by eight electrostatic capacitive sensors 1 by having the first electrode 11 and the plurality of second electrodes 12a to 12h. Accordingly, the input detector 70 detects which of the plurality of electrostatic capacitive sensors 1 the human finger 2 as the object is located in and also which of the plurality of electrostatic capacitive sensors 1 the human finger 2 contacts or applies pressing force to through the surface skin layer 15. Besides, the electrostatic capacitive sensor unit 10 can be constituted by one electrostatic capacitive sensor 1. In this case, the electrostatic capacitive sensor unit 10 comprises one first electrode and one second electrode. In this case, an electrode switching device 40 is not necessary.

REFERENCE SIGNS LIST

1: electrostatic capacitive sensor, 2: human finger (object), 3,4: resistance, 10: electrostatic capacitive sensor unit, 11: first electrode, 12a to 12h: second electrode, 13: dielectric layer, 14: substrate, 15: surface skin layer, 20, 220: constant-voltage power supply device, 21, 221: voltage application terminal, 22,222: earth terminal, 30: ammeter (detector), 31, 231: detection terminal, 32, 232: earth terminal, 40: electrode switching device, 50: state switching switch, 51: first switch, 52: second switch, 60, 160, 260: controller, 70, 170, 270: input detector, 223: constant-voltage power source, 230: detector, 233: bridge capacitor, 234: charge and discharge control device, 235: potential detector, SW10: charge and discharge switching element, SW11: input switching element, Th1: first threshold value, Th2: second threshold value, $V_{in}$: input voltage, $V_{out}$, $V_{out1}$, $V_{out2}$, $V_{out3}$: output potential

The invention claimed is:

1. An input state detection device for detecting contact or pressing of an electrically conductive object, comprising:
    an electrostatic capacitive sensor having a first electrode attached to a substrate, a second electrode located on a side of the electrically conductive object to be contacted, and a dielectric layer placed between the first electrode and the second electrode and to be compressed by pressing force applied on the second electrode by the electrically conductive object;
    a constant-voltage power supply device having a voltage application terminal connected to a side of the electrostatic capacitive sensor and applying a predetermined voltage to the electrostatic capacitive sensor;
    a detector connected in series with the electrostatic capacitive sensor, having a detection terminal connected to the side of the electrostatic capacitive sensor, and detecting an electric current flowing from the detection terminal that changes with electrostatic capacitance of the electrostatic capacitive sensor and electrostatic capacitance of the electrically conductive object;
    a state switching switch that changes a configuration of the input state detection device between a first configuration and a second configuration,
    wherein in the first configuration, the input state detection device is configured such that the voltage application terminal of the constant-voltage power supply device is connected to a side of the first electrode and the detection terminal of the detector is connected to a side of the second electrode, and
    wherein in the second configuration, the input state detection device is configured such that the voltage application terminal of the constant-voltage power supply device is connected to the side of the second electrode and the detection terminal of the detector is connected to the side of the first electrode;
an input detector for detecting (i) whether the electrically conductive object is in a non-contact state, or in a contact but not pressing state, with respect to a surface of the electrostatic capacitive sensor on the side of the second electrode, based on a value detected by the detector with the state switching switch set to the first configuration of the input state detection device, and (ii) whether the electrically conductive object is in the contact but not pressing state, or in a pressing state, with respect to the second electrode, based on a value detected by the detector with the state switching switch set to the second configuration of the input state detection device,
wherein the predetermined voltage applied by the constant-voltage power supply device is a cyclic voltage, and
wherein the input detector is an ammeter for detecting the electric current flowing from the detection terminal, and (i) when the input state detection device is in the first configuration, the input detector detects the electric currently flowing from the side of the second electrode, and (ii) when the input state detection device is in the second configuration, the input detector detects the electric currently flowing from the side of the first electrode.

2. The input state detection device according to claim 1, wherein the input detector detects magnitude of pressing force applied on the second electrode by the electrically conductive object, based on the value detected by the detector with the state switching switch set in the second configuration.

3. The input state detection device according to claim 1, further comprising:
a controller for controlling the state switching switch, wherein the controller periodically controls the state switching switch to change the configuration of the input state detection device between the first configuration and the second configuration, and
wherein the input detector periodically detects whether the electrically conductive object is in the non-contact state, or in the contact but not pressing state, and whether the electrically conductive object is in the contact but not pressing state, or in the pressing state.

4. The input state detection device according to claim 1, wherein a mode for causing the state switching switch to keep the first configuration is defined as a first mode, a mode for causing the state switching switch to keep the second configuration is defined as a second mode, and a mode for alternately and periodically switching the state switching switch between the first configuration and the second configuration is defined as a third mode;
the input state detection device comprises a controller for controlling the modes of the state switching device; and
the controller switches the state switching switch
from the first mode to the third mode when the electrically conductive object changes from the non-contact state to the contact but not pressing state,
from the third mode to the first mode when the electrically conductive object changes from the contact but not pressing state to the non-contact state,
from the third mode to the second mode when the electrically conductive object changes from the contact but not pressing state to the pressing state, and
from the second mode to the third mode when the electrically conductive object changes from the pressing state to the contact but not pressing state.

5. The input state detection device according to claim 4, wherein the input detector
determines that the electrically conductive object changes from the non-contact state to the contact but not pressing state from the value detected by the detector with the state switching switch set to the first configuration in the first mode being smaller than a first threshold value;
determines that the electrically conductive object changes from the contact but not pressing state to the non-contact state from the value detected by the detector with the state switching switch set to the first configuration in the third mode being greater than the first threshold value;
determines that the electrically conductive object changes from the contact but not pressing state to the pressing state from the value detected by the detector with the state switching switch set to the second configuration in the third mode being greater than a second threshold value; and
determines that the electrically conductive object changes from the pressing state to the contact but not pressing state from the value detected by the detector with the state switching switch set to the second configuration in the second mode being smaller than the second threshold value; and
the controller retrieves a change in the non-contact state, the contact but not pressing state and the pressing state based on the determination by the input detector.

6. The input state detection device according to claim 5, wherein the first threshold value and the second threshold value are set such that a difference between the value detected by the detector with the state switching switch set in the first configuration when the electrically conductive object is in the contact but not pressing state, and the first threshold value is greater than a difference between a value detected by the detector with the state switching switch set in the second configuration when the electrically conductive object is in the contact but not pressing state, and the second threshold value.

7. The input state detection device according to claim 1, wherein a mode for causing the state switching switch to keep the first configuration is defined as a first mode and a mode for causing the state switching switch to keep the second configuration is defined as a second mode;
wherein the input state detection device further comprises a controller for controlling the state switching switch to change the configuration of the input state detection device between the first configuration and the second configuration; and
wherein the controller switches the state switching switch
from the first mode to the second mode when the electrically conductive object changes from the non-contact state to the contact but not pressing state, and
from the second mode to the first mode when the electrically conductive object changes from the pressing state to the contact but not pressing state.

8. The input state detection device according to claim 1, wherein a plurality of the electrostatic capacitive sensors are constituted by having at least either a plurality of first electrodes or a plurality of second electrodes; and the input detector detects a position of the electrically conductive object.

9. The input state detection device according to claim 1, wherein the dielectric layer is formed of an elastomer or resin.

10. The input state detection device according to claim 1, wherein the first electrode and the second electrode are formed by mixing an electrically conductive filler in an elastomer.

11. The input state detection device according to claim 1, wherein the dielectric layer is formed of a flexible elastomer or resin that deforms when compressed and expands when not compressed,
wherein the dielectric is in contact with the first electrode and the second electrode, and
wherein the input detector detects (1) a non-contact state, (2) a contact but not pressing state, and (3) a contact and pressing state, based on a value detected by the ammeter.

12. An input state detection device for detecting contact or pressing of an electrically conductive object, comprising:
an electrostatic capacitive sensor having a first electrode attached to a substrate, a second electrode located on a side of the electrically conductive object to be contacted, and a dielectric layer placed between the first electrode and the second electrode and to be compressed by pressing force applied on the second electrode by the electrically conductive object;
a constant-voltage power supply device having a voltage application terminal connected to a side of the electrostatic capacitive sensor and applying a predetermined voltage to the electrostatic capacitive sensor;
a detector connected in series with the electrostatic capacitive sensor, having a detection terminal connected to the side of the electrostatic capacitive sensor, and detecting potential of the detection terminal that changes with electrostatic capacitance of the electrostatic capacitive sensor and electrostatic capacitance of the electrically conductive object;
a state switching switch that changes a configuration of the input state detection device between a first configuration and a second configuration,
wherein in the first configuration, the input state detection device is configured such that the voltage application terminal of the constant-voltage power supply device is connected to a side of the first electrode and the detection terminal of the detector is connected to a side of the second electrode, and
wherein in the second configuration, the input state detection device is configured such that the voltage application terminal of the constant-voltage power supply device is connected to the side of the second electrode and the detection terminal of the detector is connected to the side of the first electrode;
an input detector for detecting (i) whether the electrically conductive object is in a non-contact state, or in a contact but not pressing state, with respect to a surface of the electrostatic capacitive sensor on the side of the second electrode, based on a value detected by the detector with the state switching switch set to the first configuration of the input stated detection device, and (ii) whether the electrically conductive object is in the contact but not pressing state, or in a pressing state, with respect to the second electrode, based on a value detected by the detector with the state switching switch set to the second configuration of the input stated detection device,
wherein the detector includes
a bridge capacitor connected between the detection terminal of the detector and ground potential;
a charge and discharge switching element connected in parallel to the bridge capacitor and discharging an electric charge of the detection terminal to the ground potential when closed;
a charge and discharge control device performing discharging the electric charge of the detection terminal to the ground potential when the constant-voltage power supply device does not apply the predetermined voltage to the electrostatic capacitive sensor, and charging the electrostatic capacitive sensor by opening the charge and discharge switching element and causing the predetermined voltage to be applied by the constant-voltage power supply device after the discharging; and
a potential detector for detecting potential of the detection terminal as a value proportional to the electrostatic capacitance of the electrostatic capacitive sensor and the electrostatic capacitance of the electrically conductive object in the charging performed by the charge and discharge control device,
wherein in the first configuration of the input state detection device, the potential detector detects potential between the side of the second electrode of the electrostatic capacitive sensor connected to the detection terminal and the bridge capacitor, and in the second configuration of the input state detection device, the potential detector detects potential between the side of the first electrode of the electrostatic capacitive sensor connected to the detection terminal and the bridge capacitor.

13. The input state detection device according to claim 12, wherein the input detector detects magnitude of pressing force applied on the second electrode by the electrically conductive object, based on the value detected by the detector with the state switching switch set in the second configuration.

14. The input state detection device according to claim 12, further comprising:
a controller for controlling the state switching switch,
wherein the controller periodically controls the state switching switch to change the configuration of the input state detection device between the first configuration and the second configuration, and
wherein the input detector periodically detects whether the electrically conductive object is in the non-contact state or in the contact but not pressing state and whether the electrically conductive object is in the contact but not pressing state or in the pressing state.

15. The input state detection device according to claim 12, wherein a mode for causing the state switching switch to keep the first configuration is defined as a first mode, a mode for causing the state switching switch to keep the second configuration is defined as a second mode, and a mode for alternately and periodically switching the state switching switch between the first configuration and the second configuration is defined as a third mode;
the input state detection device comprises a controller for controlling the modes of the state switching device; and
the controller switches the state switching switch
from the first mode to the third mode when the electrically conductive object changes from the non-contact state to the contact but not pressing state, from the third mode to the first mode when the electrically conductive object changes from the contact but not pressing state to the non-contact state,
from the third mode to the second mode when the electrically conductive object changes from the contact but not pressing state to the pressing state, and
from the second mode to the third mode when the electrically conductive object changes from the pressing state to the contact but not pressing state.

16. The input state detection device according to claim 15, wherein the input detector
determines that the electrically conductive object changes from the non-contact state to the contact but not pressing state from the value detected by the detector with the state switching switch set to the first configuration in the first mode being smaller than a first threshold value;
determines that the electrically conductive object changes from the contact but not pressing state to the non-contact state from the value detected by the detector with the state switching switch set to the first configuration in the third mode being greater than the first threshold value;
determines that the electrically conductive object changes from the contact but not pressing state to the pressing state from the value detected by the detector with the state switching switch set to the second configuration in the third mode being greater than a second threshold value; and
determines that the electrically conductive object changes from the pressing state to the contact but not pressing state from the value detected by the detector with the state switching switch set to the second configuration in the second mode being smaller than the second threshold value; and
the controller retrieves a change in the non-contact state, the contact but not pressing state and the pressing state based on the determination by the input detector.

17. The input state detection device according to claim 16, wherein the first threshold value and the second threshold value are set such that a difference between the value detected by the detector with the state switching switch set in the first configuration when the electrically conductive object is in the contact but not pressing state, and the first threshold value is greater than a difference between a value detected by the detector with the state switching switch set in the second configuration when the electrically conductive object is in the contact but not pressing state, and the second threshold value.

18. The input state detection device according to claim 12, wherein a mode for causing the state switching switch to keep the first configuration is defined as a first mode and a mode for causing the state switching switch to keep the second configuration is defined as a second mode;
wherein the input state detection device further comprises a controller for controlling the state switching switch to change the configuration of the input state detection device between the first configuration and the second configuration; and
wherein the controller switches the state switching switch from the first mode to the second mode when the electrically conductive object changes from the non-contact state to the contact but not pressing state, and from the second mode to the first mode when the electrically conductive object changes from the pressing state to the contact but not pressing state.

19. The input state detection device according to claim 12, wherein a plurality of the electrostatic capacitive sensors are constituted by having at least either a plurality of first electrodes or a plurality of second electrodes; and
the input detector detects a position of the electrically conductive object.

20. The input state detection device according to claim 12, wherein the dielectric layer is formed of an elastomer or resin.

21. The input state detection device according to claim 12, wherein the first electrode and the second electrode are formed by mixing an electrically conductive filler in an elastomer.

* * * * *